United States Patent [19]
Platt et al.

[11] Patent Number: 5,381,515
[45] Date of Patent: *Jan. 10, 1995

[54] TWO LAYER NEURAL NETWORK COMPRISED OF NEURONS WITH IMPROVED INPUT RANGE AND INPUT OFFSET

[75] Inventors: John C. Platt, Mountain View; Janeen D. W. Anderson, Fremont, both of Calif.

[73] Assignee: Synaptics, Incorporated, San Jose, Calif.

[*] Notice: The portion of the term of this patent subsequent to Oct. 9, 2007 has been disclaimed.

[21] Appl. No.: 972,024

[22] Filed: Nov. 5, 1992

Related U.S. Application Data

[63] Continuation-in-part of Ser. No. 922,535, Jul. 30, 1992, Pat. No. 5,331,215, which is a continuation-in-part of Ser. No. 913,691, Jul. 14, 1992, abandoned, which is a continuation-in-part of Ser. No. 781,503, Oct. 22, 1991, Pat. No. 5,160,899, which is a continuation of Ser. No. 525,764, May 18, 1990, Pat. No. 5,059,920, which is a continuation-in-part of Ser. No. 486,336, Feb. 28, 1990, Pat. No. 5,068,622, which is a continuation-in-part of Ser. No. 282,176, Dec. 9, 1988, Pat. No. 4,935,702.

[51] Int. Cl.$^6$ .................. G06F 7/00; H03K 19/0944
[52] U.S. Cl. ........................................ 395/24; 395/27
[58] Field of Search ................. 307/201; 395/24, 27

[56] References Cited

U.S. PATENT DOCUMENTS

| | | | |
|---|---|---|---|
| 4,962,342 | 10/1990 | Mead et al. | 307/201 |
| 5,053,638 | 11/1991 | Furutani et al. | 307/201 |
| 5,059,920 | 10/1991 | Anderson et al. | 330/253 |
| 5,083,044 | 1/1992 | Mead et al. | 307/201 |
| 5,220,641 | 6/1993 | Shima et al. | 395/24 |

*Primary Examiner*—Edward P. Westin
*Assistant Examiner*—Benjamin D. Driscoll
*Attorney, Agent, or Firm*—D'Alessandro, Frazzini & Ritchie

[57] ABSTRACT

A two-layer network according to the present invention is comprised of a first-layer array of electrically-adaptable synaptic elements, inter-layer connection circuitry comprised of electrically adaptable elements, and a second-layer array of electrically-adaptable synaptic elements. Electrons may be placed onto and removed from a floating node associated with at least one MOS transistor in each electrically adaptable element, usually comprising the gate of the transistor, in an analog manner, by application of first and second electrical control signals. A first electrical control signal controls the injection of electrons onto the floating node from an electron injection structure and the second electrical control signal controls the removal of electrons from the floating node by an electron removal structure. Each synaptic element in the synaptic array comprises an adaptable CMOS inverter or other amplifier circuit. The inputs to all first-layer synaptic elements in a row are connected to a common row input line. Adapt inputs to all synaptic elements in a column are connected together to a common column adapt line. The outputs of all first layer synaptic elements in a column are connected to a common sense amplifier on a sense line. The outputs of the sense amplifiers are connected to the inputs of the synaptic elements of the second layer of the array. The outputs of all synaptic elements in a given row in the second layer of the array are connected to a common row output line. In order to adapt the synaptic elements in the array, the voltages to which the synaptic elements in a given column of the first layer of the array is to be adapted are placed onto the input voltage lines, and the synaptic elements in column n are then simultaneously adapted by assertion of an adapt signal on the adapt line for the column. The voltages to which the synaptic elements of the second layer of the array are to be adapted are placed on the row outputs lines.

22 Claims, 16 Drawing Sheets

TWO LAYER NEURAL NETWORK COMPRISED OF NEURONS WITH IMPROVED INPUT RANGE AND INPUT OFFSET

RELATED APPLICATIONS

This application is a continuation-in-part of co-pending application Ser. No. 07/922,535, filed Jul. 30, 1992, now U.S. Pat. No. 5,331,215, which is a continuation-in-part of co-pending application Ser. No. 07/913,691, filed Jul. 14, 1992, now abandoned which is a continuation-in-part of co-pending application Ser. No. 07/781,503, filed Oct. 22, 1991, now U.S. Pat. No. 5,160,899, which is a continuation of application Ser. No. 07/525,764, filed May 18, 1990, now U.S. Pat. No. 5,059,920, which is a continuation-in-part of application Ser. No. 07/486,336, filed Feb. 28, 1990, now U.S. Pat. No. 5,068,622, which is a continuation-in-part of application Ser. No. 07/282,176, filed Dec. 9, 1988, now U.S. Pat. No. 4,935,702.

BACKGROUND OF THE INVENTION

1. Field of the Invention

The present invention relates to artificial neural networks. More particularly, the present invention relates to a multi-layer array of electrically-adaptable autocompensating amplifiers for use in a two-layer neural network.

2. The Prior Art

Several schemes for using a matrix of electronic devices for neural network applications have been proposed. To date, all such schemes involve using "weights" to control the amount of current injected into an electrical node "neuron". In most prior art structures, these weights were set by controlling the value of a resistor or the saturation current of a transistor. The limitation of any such scheme is that the value of any parameter of an electronic device in an integrated circuit is not well controlled. For example, the saturation currents of two MOS transistors of the same size can differ by a factor of two if these devices are operated in the sub-threshold regime. The mechanism that adjusts the weights must take these uncertainties into account.

U.S. Pat. No. 5,083,044 discloses and claims a synaptic element comprising an adaptive amplifier. The amplifier incorporates a floating gate element and may be adapted by exposing a portion of the floating gate of the adaptive amplifier to a source of ultraviolet light. This synaptic element may be used as a trainable synapse in which the weights may be adjusted to compensate for typical transistor nonuniformities and to otherwise manipulate the weights.

It is desirable to provide an adaptive mechanism which may be adapted by electrical means whereby the amplifier electrically adjusts itself to any uncertainty in device parameters, as part of the training process. Such a synaptic element is disclosed in parent application Ser. No. 07/525,764, filed May 18, 1990, now U.S. Pat. No. 5,059,920. This synaptic element has the advantage that it may be electrically adapted while the circuit is in its normal operating regime.

Single layer neural networks utilizing autocompensating amplifiers have been taught in the prior related applications listed above. Single layer networks are limited in that they cannot perform solutions to problems which are not linearly separable. This means that there is a large set of simple problems which cannot be solved by single layer networks because it is too difficult for them to map their input space into their output space. It has been proven mathematically that by adding a single layer to a neural network, the capability may be provided to map any function.

The present application extends the disclosure of the parent application to include a two-layer electrically-trainable neural network.

BRIEF DESCRIPTION OF THE INVENTION

A two-layer network according to the present invention is comprised of a first-layer array of electrically-adaptable synaptic elements, inter-layer connection circuitry comprised of electrically adaptable elements, and a second-layer array of electrically-adaptable synaptic elements. Electrons may be placed onto and removed from a floating node associated with at least one MOS transistor in each electrically adaptable element, usually comprising the gate of the transistor, in an analog manner, by application of first and second electrical control signals. A first electrical control signal controls the injection of electrons onto the floating node from an electron injection structure and the second electrical control signal controls the removal of electrons from the floating node by an electron removal structure.

Each synaptic element in the synaptic array comprises an adaptable CMOS inverter or other amplifier circuit, as disclosed in application Ser. No. 07/525,764, filed May 18, 1990, now U.S. Pat. No. 5,059,920. This United States Patent is expressly incorporated herein by reference. This patent discloses the use of electrical adaptation to store an analog voltage on a floating node for the purpose of canceling any offsets in analog amplifier circuits. The methods taught therein may be used to store an arbitrary analog voltage on the floating node and can thus be used to store a weight in a synaptic element of a neural network array. In its simplest embodiment, the synaptic element of the first array may comprise a CMOS inverter in which the gates of the P-Channel and N-Channel MOS transistors are connected to a floating node and wherein the input node to the inverter is coupled to the floating node by a capacitor. An electrical adaptation circuit is connected between the output and the floating node of the synaptic element.

The inputs to all synaptic elements in a row (or, alternatively, a column) are connected to a common row (or column) input line. Adapt inputs to all synaptic elements in a column (or, alternatively, a row) are connected together to a common column (or row) adapt line. The current supplied to all amplifiers in a column is commonly provided by a sense line.

In order to adapt the synaptic elements in the M row by N column matrix of the present invention, the voltages to which a given column n of the matrix is to be adapted are placed onto the input voltage lines, and the synaptic elements in column n are then simultaneously adapted by assertion of an adapt signal on the adapt line for column n in the manner disclosed in U.S. Pat. No. 5,059,920.

The vectors of input voltages for adapting successive columns may be placed sequentially onto the row input voltage lines and used to adapt the columns of synaptic elements by assertion of the adapt signals on the appropriate column adapt lines until the entire array is electrically adapted. After each synaptic element has been adapted, the current flowing through it will be maximized when the voltage at the input of the synaptic element equals the voltage to which the synaptic element has been adapted.

The inter-layer connection circuitry may comprise a row of current-sense amplifiers with one amplifier per column of the first layer array sensing the summed current output of the first layer column.

According to a second aspect of the present invention, a blending synapse is disclosed. The synaptic element of the second layer of the array may comprise a wide-range CMOS transconductance amplifier in which the gate of the negative input transistor is connected to a floating node and wherein the floating node is coupled by capacitors to a fixed reference voltage and to the shared output of the row of synaptic elements. An electrical adaptation circuit is connected between the output of the amplifier and the floating node of the synaptic element. The input of the synaptic element is the bias of the transconductance amplifier which is connected to the voltage output of the current-sense amplifier.

An array of blending synapses is also disclosed. A plurality of adaptable blending synapses is placed in a M by O array. The inputs of all synaptic elements in each column are commonly connected to one of a plurality of column input lines. The adapt inputs in each column are commonly connected to one of a plurality of adapt input lines. The current supplied to all synaptic elements in a column is commonly set by a weight. In normal operation, the outputs of all synaptic elements in a row are commonly connected to a row output line.

Synapses in each column of the array can be simultaneously adapted by asserting the common column adapt line, and driving the desired adaptation voltages on the O output lines. The synaptic amplifiers thereby adapt their stored voltage value to generate the desired output.

A two-layer network is formed by connecting each of the outputs of the first array to current-sense amplifiers, the outputs of which are each connected to an input of the second layer of the array.

BRIEF DESCRIPTION OF THE DRAWINGS

FIG. 1b is a plot of output current as a function of input voltage for the electrically adaptable synapse of FIG.1a.

FIGS. 2b–2f are several structural implementations of the device of FIG. 2a.

FIG. 7b is a simplified and generalized schematic diagram of an electrically-adaptable synaptic element such as is shown in FIG. 7a.

DETAILED DESCRIPTION Of A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
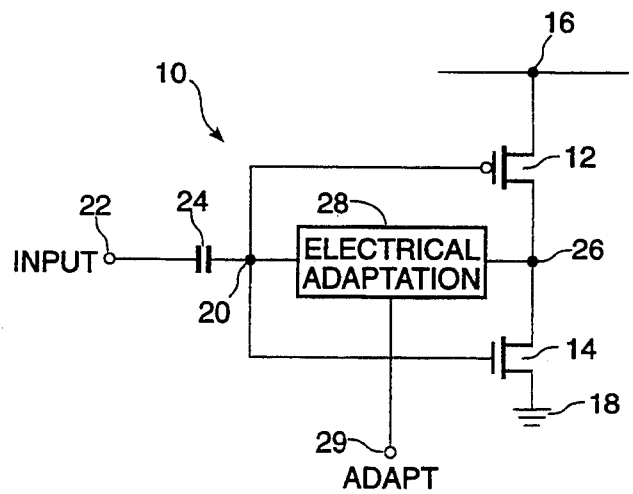
FIG. 1a is a schematic diagram of an electrically adaptable synapse according to the present invention.

Referring first to FIG. 1a, a schematic diagram of a first embodiment of a synaptic element circuit structure is shown which is useful for performing the long term analog learning function. Synaptic element 10 comprises a CMOS inverter including P-Channel MOS transistor 12 and N-Channel MOS transistor 14 connected in series between a current sense node 16 and a power supply rail 18 shown as ground. The input node 20 of the inverter, comprising the gates of MOS transistors 12 and 14, is a floating node and is coupled to the circuit input node 22 via capacitor 24. The output node 26 of the inverter comprises the common connection of the drains of MOS transistors 12 and 14.

The source of P-Channel MOS transistor 12 forms a sense node 16 for the synaptic element of FIG. 1a. Those of ordinary skill in the art will readily observe that the source of N-Channel MOS transistor 14 could form the sense node 16 of the synaptic element of FIG. 1a. In this case, the source of P-Channel MOS transistor 12 would be connected to a voltage rail such as $V_{DD}$. Such a circuit would be equivalent to the circuit of FIG. 1a.

An electrical adaptation circuit, shown in block form at reference numeral 28, is connected between the output node 26 and the floating node 20. Presently preferred structures for performing the electrical adaptation function are disclosed and claimed in U.S. Pat. No. 4,953,928, which is expressly incorporated herein by reference. These structures include both means for injecting electrons onto floating node 20 and means for extracting electrons from floating node 20. The operation of electrical adaptation circuit 28 is controlled by an adapt node 29, as will be disclosed herein.

Those of ordinary skill in the art will recognize from the disclosure herein that, in its simplest form, synaptic element 10 may comprise a single MOS transistor with its gate comprising a portion of floating node 20. As disclosed herein, synaptic element 10 may comprise a variety of different amplifying elements, each useful for performing different functions. For example, the circuit disclosed in FIG. 5 of U.S. Pat. No. 5,099,156 may be used as a synaptic element in the arrays disclosed herein, with the understanding that the drain nodes of all like legs of synapses in a single column are each commonly connected to corresponding sense amplifier loads. Those of ordinary skill in the art will be able to select appropriate amplifying elements to use as synaptic elements in accordance with the particular application to be addressed in light of the teachings herein.

It is presently preferred to inject electrons onto floating node 20 using a non-avalanche hot electron injection semiconductor device. Suitable semiconductor devices for performing non-avalanche hot electron injection are depicted in FIGS. 2a-2f.

Figure 1B:
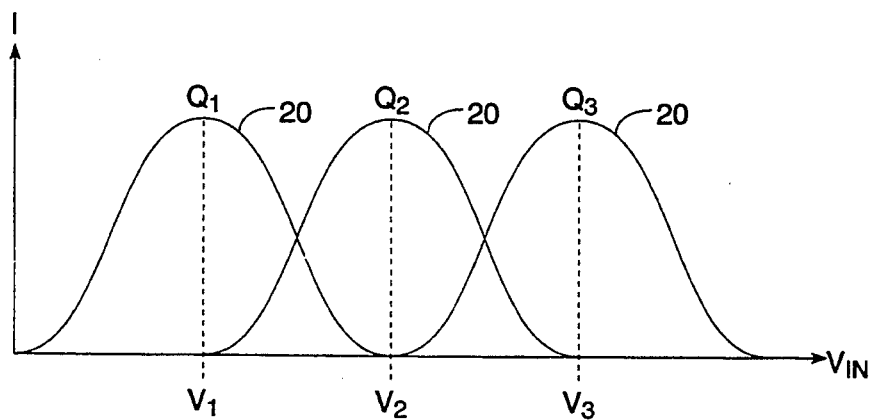

Referring now to FIG. 1b, the three curves (leftmost, center, and right-most) show the current drawn by the synaptic element 10 of FIG. 1a as a function of input voltage for three cases in which the circuit has been adapted to different voltages $V_1$, $V_2$, and $V_3$, respectively. Each curve corresponds to a different charge (Q1, Q2, Q3, respectively) stored on the floating node. A characteristic of the CMOS inverting amplifier of FIG. 1a is that when the input voltage is equal to the voltage to which the circuit has been adapted, the output current is maximized as shown in the three curves of FIG. 1b.

Figure 2A:
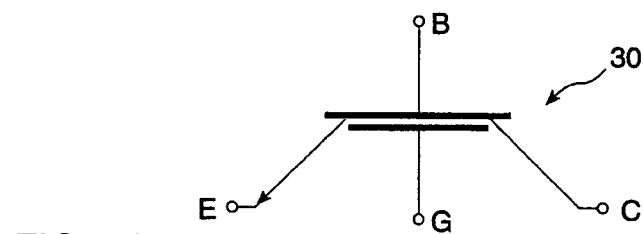
FIG. 2a is a generic schematic symbol for a non-avalanche hot electron injection device.

Referring first to FIG. 2a, a generic schematic symbol for a non-avalanche hot electron injection device is shown at reference numeral 30 as an NPN bipolar transistor having an insulated gate member in addition to its base, emitter, and collector regions. In the structural implementations which follow as FIGS. 2b-2f, this NPN transistor is shown as both a lateral device and a vertical device. As an aid to interpretation of the following figures, like structures are given like reference numerals.

Figure 2B:
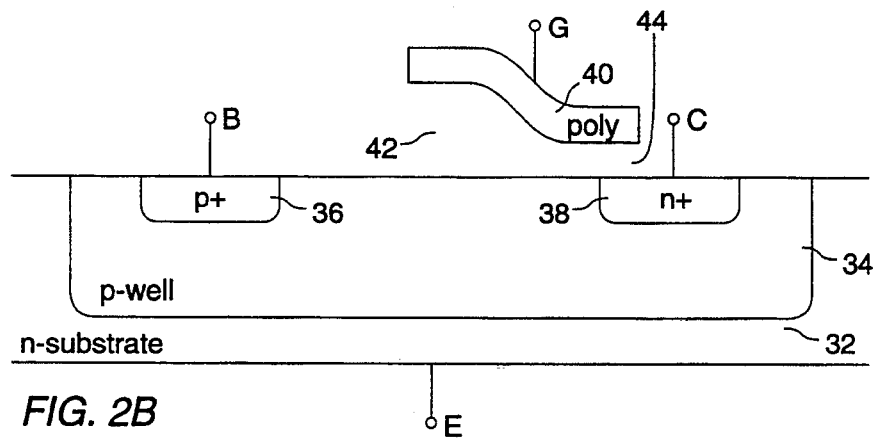

Referring to FIG. 2b, a first embodiment of the device of FIG. 2a may be fabricated on a semiconductor substrate 32 of n-type conductivity, which serves as the device emitter. A well region 34 of a p-type conductivity, serving as the base of the device, is formed in substrate 32. A p-type contact doped region 36 serves as the base contact. A doped region 38 having an n-type conductivity serves as the collector of the device.

A polysilicon floating gate 40 (which forms floating node 20 of the amplifiers disclosed herein) is formed above the surface of the well structure 34 and is separated from the surface of the well by an insulating layer 42. A portion of floating gate 40, lying at least partially above doped region 38, is separated from the surface of the well by an insulating layer 44, having a thickness less than the thickness of insulating layer 42.

Figure 2C:
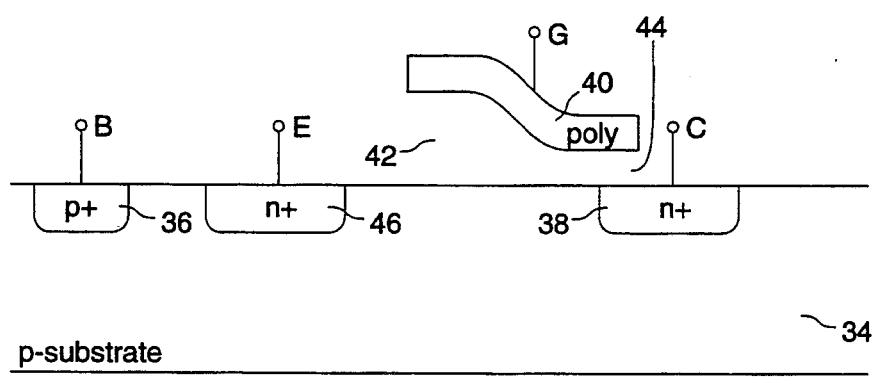

In an alternative embodiment shown in FIG. 2c, the well region may be eliminated if a p-type substrate region 34 is used which, like the well region 34 of FIG. 2b, serves as the base of the device, with doped region 36 used as the base contact. N-type doped region 38 serves as the collector of the device. In this embodiment, another n-type doped region 46 in substrate 34 serves as the emitter of the device.

Figure 2D:
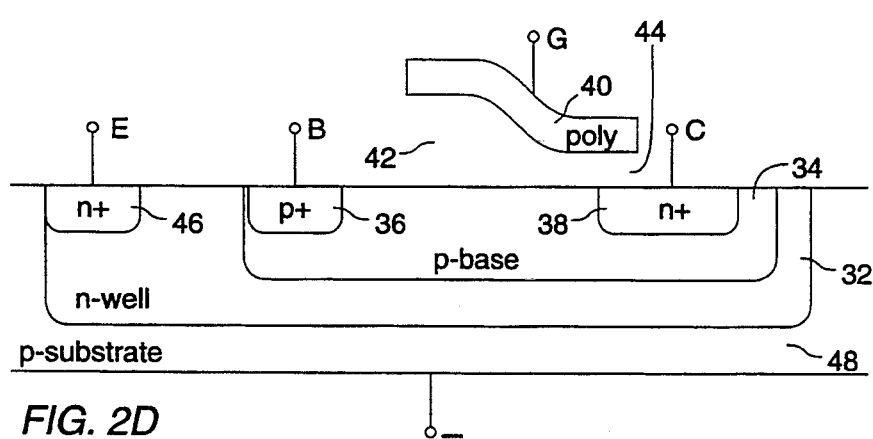

The embodiment shown in FIG. 2d is much like the embodiment of FIG. 2b except that region 32, the substrate in FIG. 2b, is a n-well region in a p-type substrate 48 and an n-type doped region 46 in n-well region 32 serves as the emitter contact of the device.

Figure 2E:
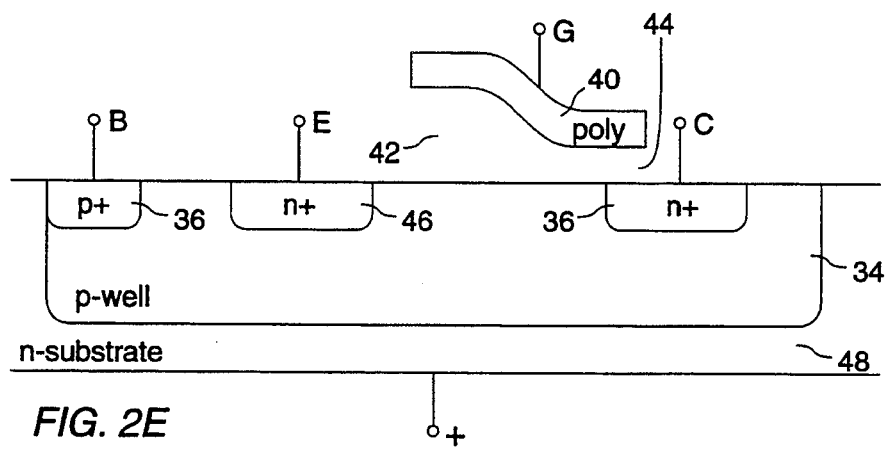

The embodiment of FIG. 2e is similar to the embodiment of FIG. 2b but the emitter of the device is an n-type doped region 46 in the p-well region 34 instead of the substrate 32 in FIG. 2b.

Figure 2F:
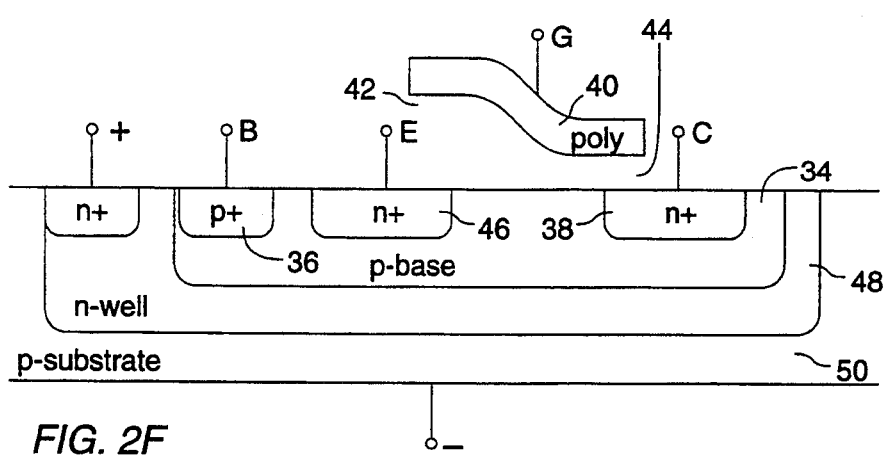

The embodiment of FIG. 2f is like the embodiment of FIG. 2e but the substrate 48 of FIG. 2e is an n-well 48 in a p-type substrate 50 in FIG. 2f.

Typically, the well regions in the structures shown in FIGS. 2b-2f may be on the order of 3 microns in depth, doped to concentrations in the area of about $1 \times 10^{16}$ atoms/cm$^3$. The substrate regions may be doped to concentrations on the order of about $5 \times 10^{15}$ atoms/cm$^3$. The diffusion regions in the wells and substrates may be on the order of about 0.3 microns in depth, doped to a concentration of about $1 \times 10^{20}$ atoms/cm$^3$. The base regions in FIGS. 2d and 2f may be about 0.5 microns in depth, doped to a concentration of about $1 \times 10^{17}$ atoms/cm$^3$. The preferred dopant species is boron, although those of ordinary skill in the art will understand that other species may be used. Those of ordinary skill in the art will recognize that, as time advances, the dimensions used in a typical CMOS process will become smaller, and the doping densities, etc., will scale accordingly.

In the presently preferred embodiments of FIGS. 2b-2f, the gate oxide thicknesses should be about 400 angstroms and polysilicon gate layer thicknesses should be about 4,000 angstroms, and the polysilicon gates should be doped to a level of about $1 \times 10^{21}$ atoms/cm$^3$. The capacitive coupling of the polysilicon gate to the collector of these devices should be about 20 femtofarads.

Figure 2G:
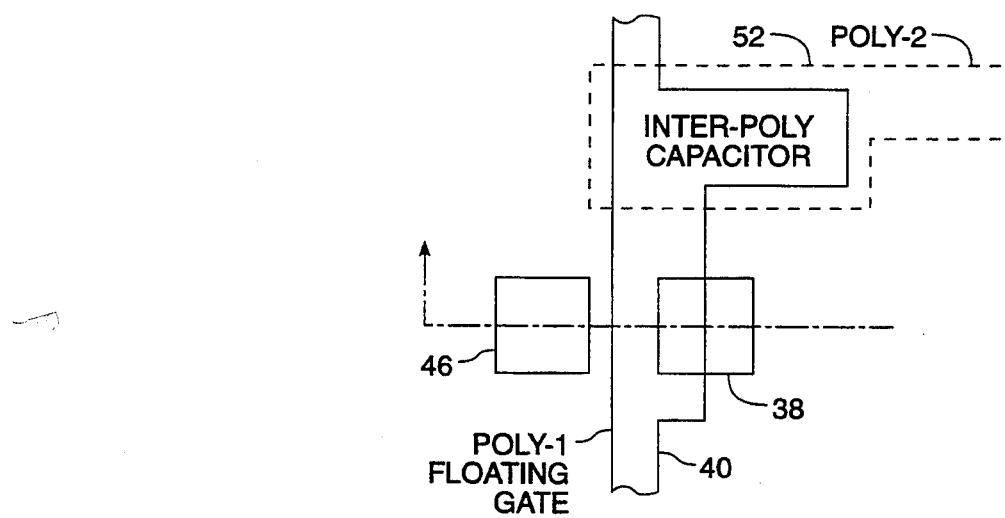
FIG. 2g is a top view of the central portions of structures of FIGS. 2b–2f, showing the positioning of a second polysilicon layer.

FIG. 2g is a top view of the central portions of structures of FIGS. 2b-2f, showing the positioning of a second polysilicon layer. A region of second layer polysilicon 52 overlies a large portion of floating gate 40, is separated therefrom by a layer of interpoly oxide, and is thus capacitively coupled thereto. The interpoly oxide layer may comprise a layer of silicon dioxide (SiO$_2$) as is well known in the art. The second polysilicon layer 52 may be formed as a standard second electrode from second level polysilicon using conventional CMOS processing techniques. The second layer polysilicon region 52 is used to hold polysilicon floating gate 40 at a desired potential through capacitive coupling.

Figure 2H:
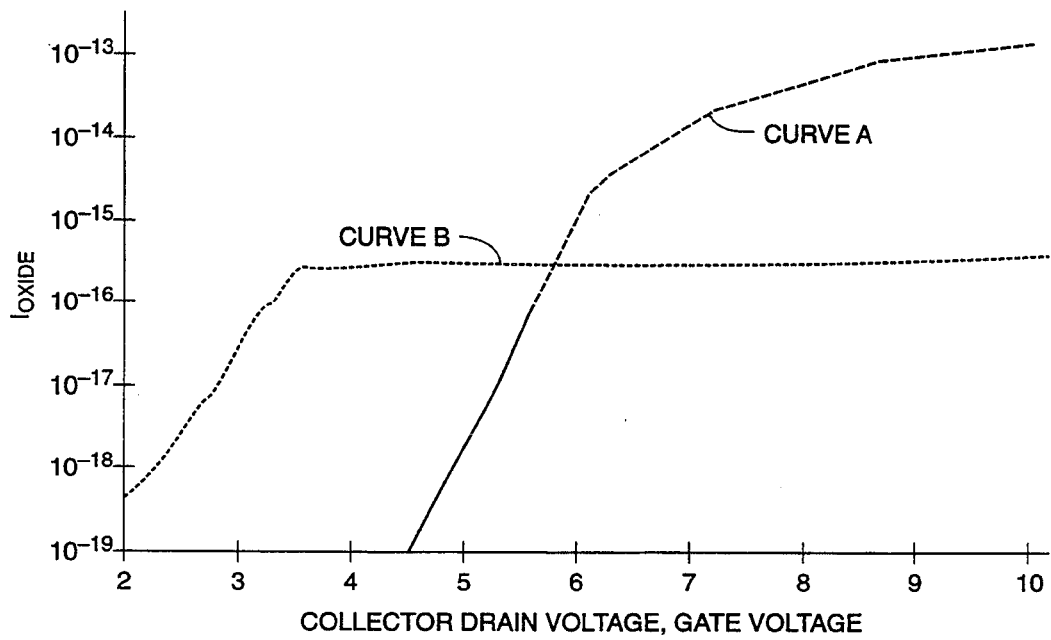
FIG. 2h is a graph in which curve A is a graph of current injected on to the floating node as a function of the voltage on the floating node and curve B is a graph of current injected on to the floating node as a function of collector voltage of the hot electron injection device measured with respect to its base at a device current level of 500 nanoamperes.

Curve A of FIG. 2h is a graph of current injected on to floating node 20 as a function of the voltage on floating node 20. It can be seen that the rate of hot electron injection becomes exponentially small as the floating gate voltage decreases. The field in the oxide should preferably be in the direction to encourage electrons to flow from substrate to floating gate, meaning that the voltage on the floating gate should preferably be more positive than the collector. Curve B is a graph of current injected on to floating node 20 as a function of collector voltage of hot electron injection device 70 measured with respect to its base. These curves were taken with a collector current of approximately 500 nanoamperes. It can be seen that the rate of hot electron injection becomes very low for collector voltages below about 2 volts. The rate of electron injection was found to be proportional to the collector current over several orders of magnitude below this current level. Thus, either the collector current or the collector voltage, or both, may be used as electrical inputs whereby the electron injection rate on to floating node 20 may be controlled over many orders of magnitude without significantly affecting the voltage on the floating node 20, provided that the capacitive coupling between the floating node 20 and the collector is significantly smaller than the capacitance of capacitor 24. The ratio of these capacitances is preferably greater than about 10:1 to avoid changing the voltage on the floating node when the voltage on the collector is lowered to terminate injection.

In a presently preferred embodiment of the invention, the means for removing electrons from the floating node 20 of the amplifiers disclosed herein is an interpoly tunneling device. Referring to FIG. 3a a generic schematic symbol 60 for such a device is shown.

Figure 3C:
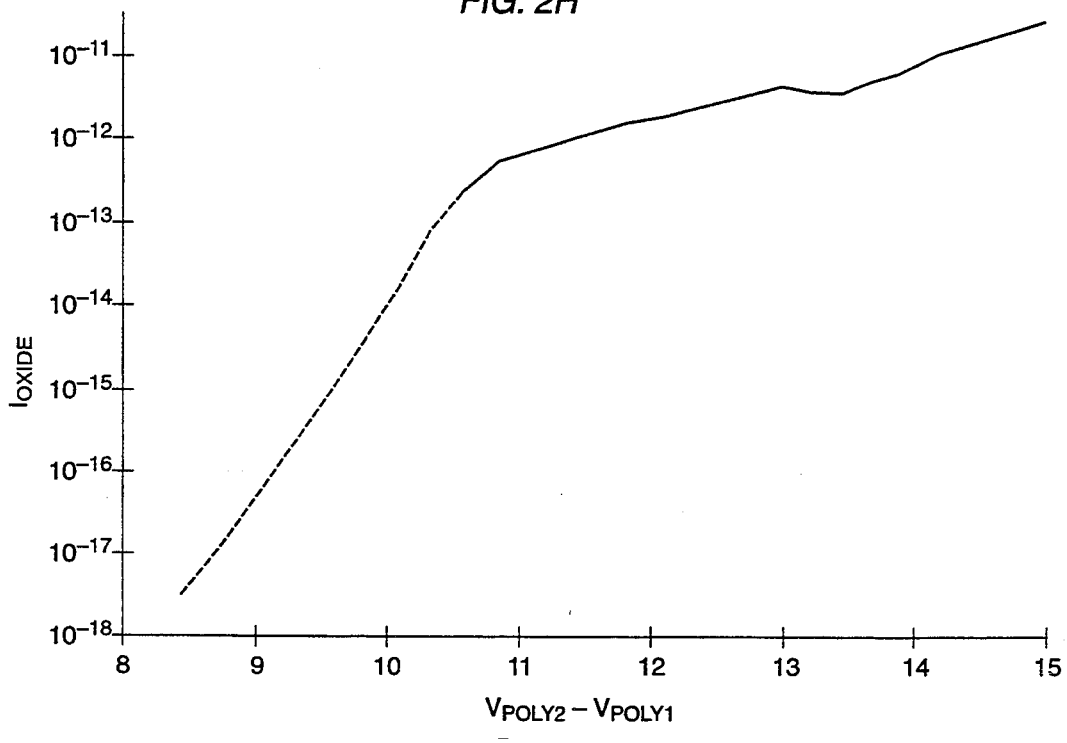
FIG. 3c is a graph of interpoly tunneling current versus interpoly voltage for the tunneling device of FIGS. 3a and 3b.
Figure 3A:
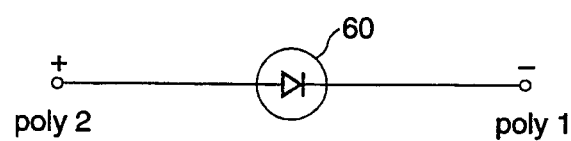
FIG. 3a is a generic schematic symbol for an interpoly tunneling device.
Figure 3B:
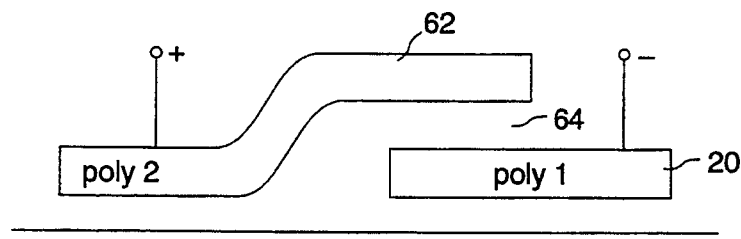
FIG. 3b is a cross sectional view of a presently preferred interpoly tunneling device.

Referring to FIG. 3b, this interpoly tunneling device is shown to preferably include a second layer of polysilicon 62, which may have a thickness of about 4,000 angstroms and an arsenic doping concentration of about $1 \times 10^{21}$, disposed above a selected portion of floating node 20 and separated therefrom by an insulating layer 64 having a thickness on the order of about 500 angstroms. The capacitance between second polysilicon layer 62 and floating node 20 should preferably be kept as small as allowed by the design rules of the fabrication process.

By varying the voltage on second layer of polysilicon 62, the rate of electron removal from floating node 20 can be controlled from zero (no tunneling) at zero volts, to $10^{-12}$ amperes at 11 volts, these voltages being measured relative to floating node 20. Thus the voltage on second layer polysilicon 62 may be used as an electrical input whereby the rate of electron removal from floating node 20 may be controlled over many orders of magnitude without significantly affecting the voltage on floating node 20, provided that the capacitive coupling between the floating node 20 and the second polysilicon layer 62 is significantly smaller than the capacitance of capacitor 24. The ratio of these capacitances is preferably greater than 10:1 to avoid changing the voltage on the floating node when the voltage on node 62 is lowered to terminate tunneling.

Referring now to FIG. 3c, a graph showing interpoly tunneling current as a function of interpoly voltage actually measured in a device fabricated according to the present invention, it can be seen that the tunneling rate can be controlled over orders of magnitude. For voltages less than 8 volts, the rates were so small that measurements would have taken many hours, however it has been established that the exponential dependence of the tunneling current as a function of interpoly voltage continues to exponentially smaller values of the current. Therefore, by applying interpoly voltages of less than 2 volts, it is possible to effectively disable the tunneling process and therefore leave the injected charge on the floating node 20 stable over a period of many years.

If it is assumed that electrical adaptation circuit 28 includes a tunneling device 60 connected between output node 26 and controlled by control circuitry and floating node 20 and a hot electron injection device 30, connected to output node 26 and to one or more voltage sources and controlled by the voltage on output node 26 as taught herein, it can be seen that the operation of the circuit of FIG. 1a depends on the state of the active low adapt node 29 and the voltage on floating node 20. If adapt node 29 is high, the learning function is disabled and the amplifier operates with its crossover point determined by whatever charge is stored on floating node 20.

If, however, adapt node 29 is low, electrons will be caused to enter or leave floating node 20, depending on the state of the voltage on node. If the voltage on node 26, reflecting the input voltage $V_{in}$ and the voltage on floating node 20, is low, the voltage at the first end of the tunneling device 60 will drop to a value below the voltage at which tunneling will take place. In addition, hot electron injection device 30 will cause hot electrons to be injected onto floating node 20. If the voltage on node 26, reflecting the input voltage $V_{in}$ and the voltage on floating node 20 is high, hot electron injection device 30 will be turned off.

The auto-compensating amplifier synaptic elements of the present invention are thus characterized by the ability to accomplish two-way continuous learning of an analog value onto the floating node. As used herein, "two-way continuous" learning, is the ability to both inject and remove electrons from floating node 20 in a continuous manner while the amplifier continues to operate normally, and the device is performing its in-circuit function and the voltage on the floating node is within the normal operating range of the device.

Figure 4A:
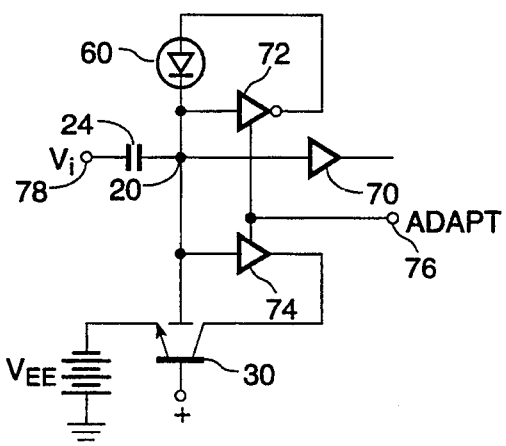
FIGS. 4a–4f are schematic diagrams of several alternative circuits for auto-compensating amplifiers useful in synaptic arrays according to the present invention.
Figure 4B:
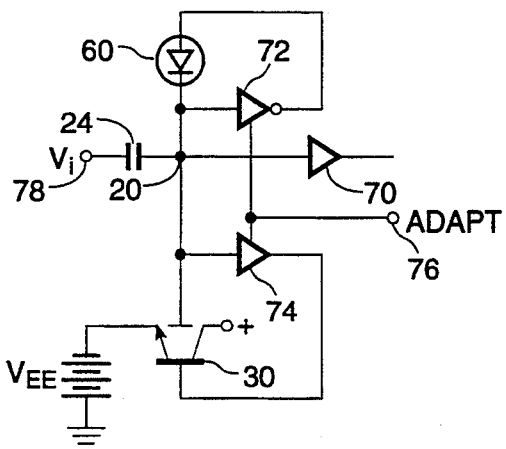
Figure 4C:
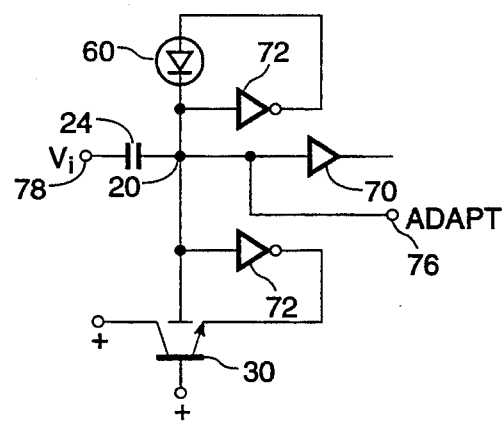

Several alternative circuits for auto-compensating amplifiers according to the present invention are shown in FIGS. 4a–4c. Referring first to FIG. 4a, an amplifier 70 has its input connected to floating node 20. Also connected to floating node 20 are the inputs of enabled inverting amplifier 72 and enabled non-inverting amplifier 74. The enable inputs of amplifiers 72 and 74 are connected to an adapt input 76. The circuit input node 78 is capacitively coupled to floating node 20 via capacitor 24.

The output of enabled inverting amplifier 72 is connected to the poly 2 end of interpoly tunneling device 60. The other end of interpoly tunneling device 60 is floating node 20. The output of enabled non-inverting amplifier 74 is connected to the collector of hot electron injection device 30. The emitter of hot electron injection device 30 is connected to a voltage $V_{EE}$ as shown in FIG. 4a by the battery symbol, its base is connected to a source of positive voltage, and its gate is floating node 20.

It should be noted that the capacitance between the collector of non-avalanche hot-electron injection device 30 acts as positive feedback in the circuit, and can introduce hysteresis that will limit the accuracy with which the auto-compensation can be accomplished. For this reason, it is desirable under most circumstances to limit the effective gain around the loop from floating node 20, through amplifier 74, through the capacitance $C_C$ between the collector of hot-electron injection device 30 and floating node 20. The magnitude of this loop gain is approximately the amplifier gain A multiplied by the ratio of $C_c$ to the total capacitance $C_{TOT}$ of node 20 to all other nodes, including the input. If this loop gain is less than one, then the absence of hysteresis behavior is assured, which allows the floating node to operate in the normal operating range of amplifier 74 during adaptation.

When adapt input 76 is disabled, amplifiers 72 and 74 are disabled and amplifier 70 operates to amplify the voltage present at input node 78. When adapt input 76 is enabled, amplifiers 72 and 74 are enabled and the voltage on floating node 20 is adapted to the voltage required to store the synaptic weight. During adaptation, amplifier 70 continues to perform its amplifying function, i.e., it does not have to be placed in a special non-functioning state to be adapted. If the floating node voltage as coupled by input voltage $V_{in}$ is low such that the output voltage of inverting enabled amplifier 72 is high, the tunneling device 60 is enabled and increases the voltage on the floating node 20. If the floating node voltage as coupled by input voltage $V_{in}$ is high such that the output voltage of non-inverting enabled amplifier 74 is low, the hot electron injection device 70 is enabled and decreases the voltage on the floating node 20.

The embodiments of FIGS. 4b and 4c are similar to the embodiment of FIG. 4a and differ in the manner in which the hot electron injection device 30 is connected to the circuit. Whereas in FIG. 4a adaptation by the hot electron injection device is controlled by collector voltage, in FIGS. 4b and 4c adaptation is controlled by collector current. In FIG. 4b, the output of non-inverting enabled amplifier 74 is connected to the base of hot electron injection device 30 and the collector of hot electron injection device 30 is connected to a source of positive voltage. In FIG. 4c, the output of a second inverting enabled amplifier 72 is connected to the emitter of hot electron injection device 30 and the collector and base of hot electron injection device 30 are both connected to sources of positive voltage. Varying these voltages will affect the injection rate. Those of ordinary skill in the art will readily appreciate that amplifier 70 can be used to perform the functions of either amplifier 72 or 74, or, if provided with both inverting and non-inverting outputs, of both amplifiers 72 and 74, which are shown separately for clarity.

Figure 4D:
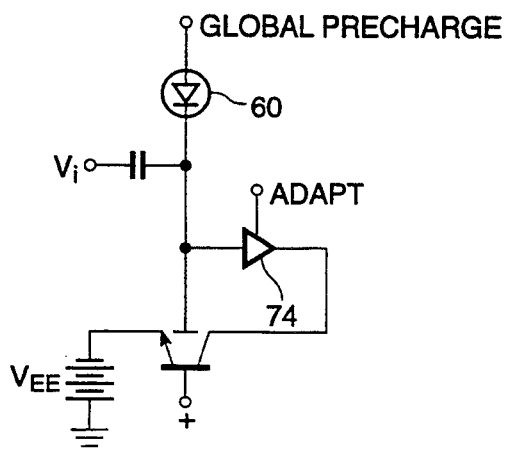
Figure 4E:
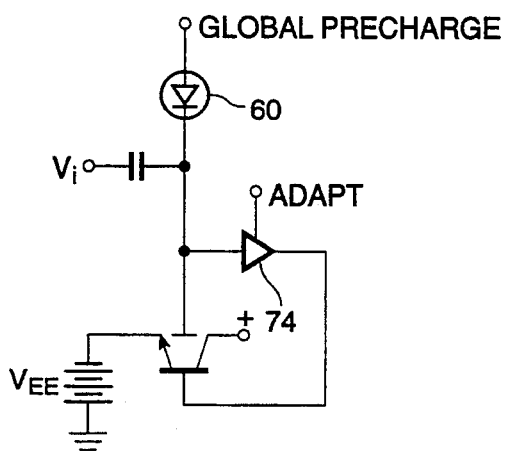
Figure 4F:
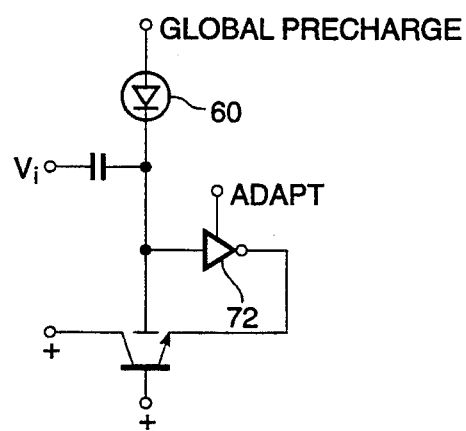

As an alternative to the arrangement of FIGS. 4a–4c, amplifier 72 may be eliminated and the first end of tunneling device 60 may be connected to a node which can be used as a precharge node by the application of a positive voltage, as shown in FIGS. 4d–df.

Many amplifiers on a single integrated circuit can be precharged by raising the precharge input to a voltage at which tunneling takes place. After some time, the offset voltages of all amplifiers will be of the same sign, and the precharge input voltage can be reduced to a value at which the tunneling current is negligible. The hot-electron injection devices in each individual amplifier can then adapt each amplifier until its individual offset is compensated by the hot-electron injection structure associated with that amplifier. After compensation has taken place, hot-electron injection is reduced to a negligible level by the negative feedback control of hot electron injection through amplifier 74 and second inverting amplifier 72, exactly as is the case of FIGS. 4a–4c.

Figure 5:
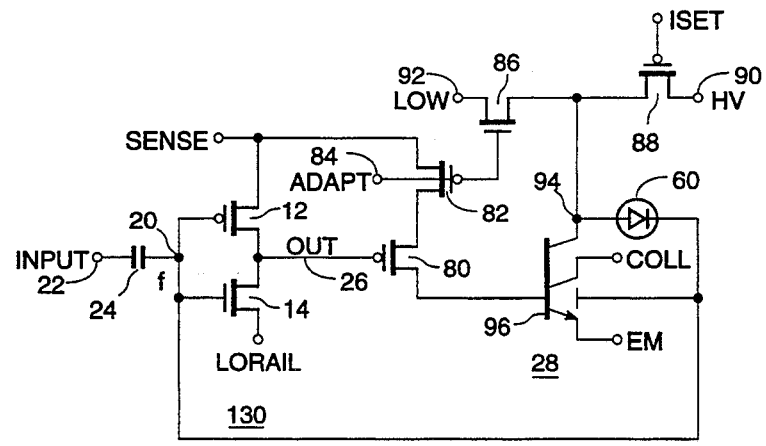
FIG. 5 is a schematic diagram of an embodiment of the present invention according to FIG. 4b.
Figure 6A:
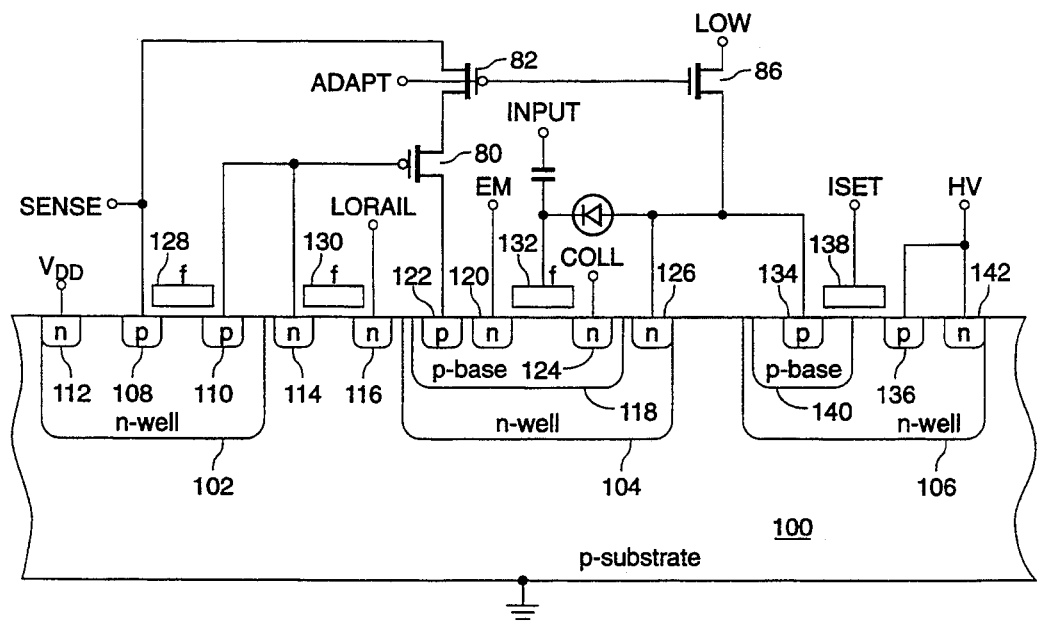
FIGS. 6a and 6b are, respectively, cross-sectional and top views of a silicon implementation of the circuit of FIG. 5.
Figure 6B:
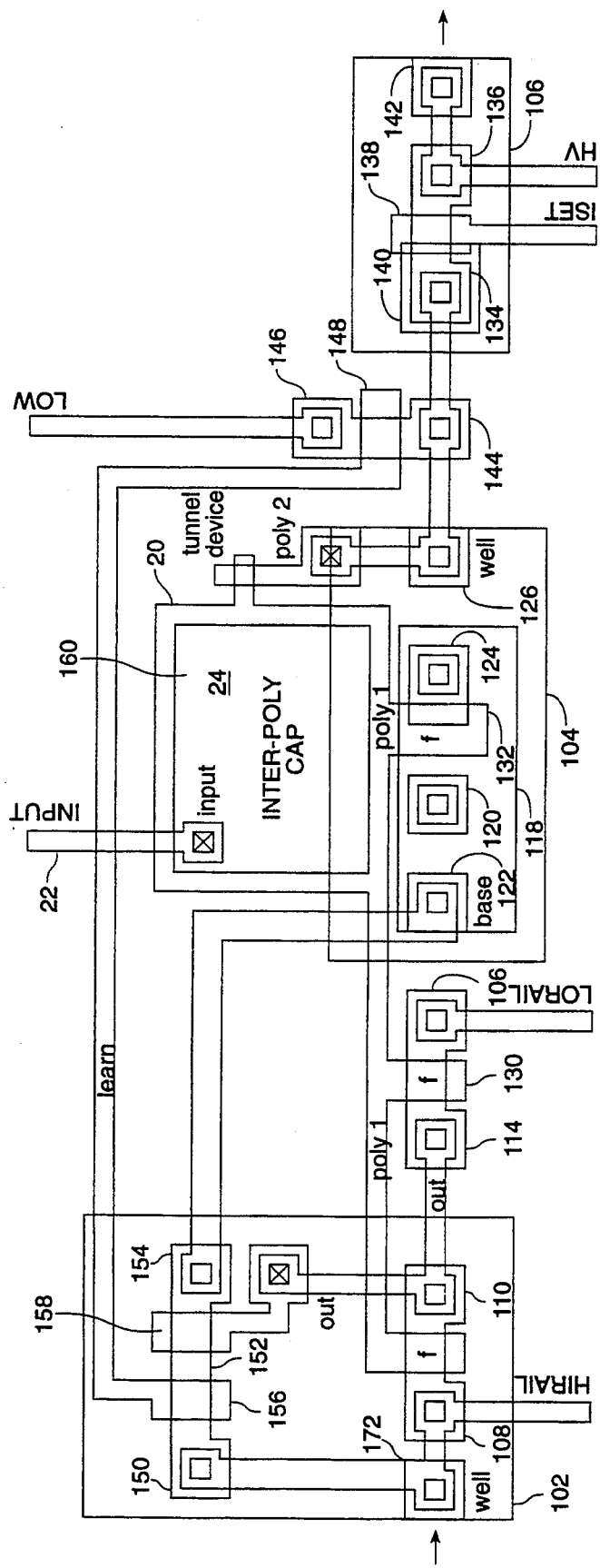

Referring now to FIGS. 5 and 6a–6b, a schematic diagram of a presently preferred embodiment of the circuit of FIG. 4b is shown, using the simple inverter of FIG. 1a as the amplifier element 70. As previously stated, those of ordinary skill in the art will readily understand that other amplifier circuits may be used in place of the simple inverter. The inverter comprises P-Channel MOS transistor 12 in series with N-Channel MOS transistor 14. The gates of transistors 12 and 14 comprise a floating node 20, which is coupled to the amplifier input node 22 through capacitor 24. The output node 26 of the synaptic element 10 is the common connection of the drains of MOS transistors 12 and 14. The source of P-Channel MOS transistor 12 forms a sense node for the synaptic element of FIG. 5. Electrical adaptation circuit 28 is connected between the output node 26 and the floating node 20.

Output node 26 is connected to the gate of P-channel MOS transistor 80. The source of P-Channel MOS transistor 80 is connected to the drain of P-Channel MOS transistor 82, whose source is connected to the positive voltage rail and whose gate is connected to a low-active adapt signal node 84. Low active adapt signal node 84 is also connected to the gate of an N-Channel MOS transistor 86. N-channel MOS transistor 86 is connected in series with P-Channel MOS transistor 88 between a source of high positive voltage 90 and a source of low voltage 92. The first end of tunneling device 60 at node 94 is connected to the common connection of the drains of transistors 86 and 88, and the other end is floating node 20. Source of high positive voltage 90 should be at a voltage high enough to cause tunneling to take place in tunneling device 60, and source of low voltage 92 may be ground or any voltage at which tunneling in tunneling device 60 may take place at an acceptably slow rate. The gate of P-channel MOS transistor 88 is connected to a voltage node $I_{set}$ which will cause a trickle current, e.g., less than about 0.5 microamperes, to flow through P-channel MOS transistor 88.

The drain of P-Channel MOS transistor 80 is connected to the base of hot electron injection device 96, which, in this embodiment includes a double collector NPN bipolar transistor with an insulated MOS polysilicon gate which is electrically connected to floating node 20. One of the collectors of hot electron injection device 96 is connected to the common connection of the drains of transistors 86 and 88. Its other collector is used as an enable input and its emitter is connected to a source of bias voltage.

FIGS. 6a and 6b are, respectively, a cross sectional view and a top view of a presently preferred layout for the circuit depicted in FIG. 5. Referring first to FIG. 6a, the circuit of FIG. 5 may be fabricated on p-type substrate 100 in which n-wells 102, 104, and 106 are conventionally formed. P-channel MOS transistor 12 is formed in n-well 102, and has doped p-type regions 108 and 110, which act as its source and drain respectively. N-type doped region 112, the contact to the n-well 102, is connected to a source of positive voltage, which may be $V_{DD}$ or a higher voltage to produce a body effect in P-channel MOS transistor 12 to alter the shape of its current output characteristic as is known in the art.

N-type doped regions 114 and 116 form the drain and source, respectively, of N-channel transistor 14. Hot electron injection device 96 is formed inside n-well 104, which serves as the first collector of the device. P-type base region 118 contains n-type region 120, serving as the emitter of the device, p-type region 122, serving as the base contact of the device, and n-type region 124, serving as the second collector of the device. N-type region 126 serves as the contact for the first collector.

The gates of transistors 12, 14, shown at reference numerals 128 and 130, and the gate of hot electron injection device 96, shown at reference numeral 132 are fabricated from the layer of polysilicon which comprises floating node 20.

P-channel MOS transistor 88 is constructed in n-well 106, in which p-type doped regions 134 and 136, respectively, serve as its drain and source, and polysilicon region 138 serves as its gate. P-type region 134 is placed inside lightly doped drain p-region 140. N-type region 142 is used to connect the source of high voltage to the source of MOS transistor 88.

Referring now to FIG. 6b, a top view of the structure of the semiconductor cross section of FIG. 6a, n-type regions 144 and 146 serve as the drain and source, respectively, of N-channel MOS transistor 86, and polysilicon region 148 serves as its gate. P-type regions 150 and 152 serve as the source and drain of P-channel MOS transistor 82, p-type regions 152 and 154 serve as the source and drain of P-channel MOS transistor 80, and polysilicon regions 156 and 158, respectively, serve as their gates.

Input node 22 is connected to polysilicon layer 160 which serves as the input plate of capacitor 24. Floating node 20 forms the other plate of capacitor 24.

The operation of the circuit of FIG. 5 depends on the state of the active low adapt input node 84 and the voltage on floating node 20. If adapt node 84 is high, P-channel MOS transistors 80 and 82 are turned off, and N-channel MOS transistor 86 is turned on, thus disabling the learning function, and the inverter comprising transistors 12 and 14 operates with its crossover point determined by whatever voltage is on floating node 20.

If, however, node 84 is low, electrons will be caused to enter or leave floating node 20, depending on the state of the voltage on inverter output node 26. If the voltage on floating node 20, reflecting the input voltage $V_{in}$ and the voltage on floating node 20, is high, such that the inverter output node 26 is low, P-channel MOS transistors 80 and 82 will both be turned on, causing base current to flow in hot electron injection device 96. The collector current through hot electron injection device 96 will drop the voltage at node 94, the first end of the tunneling device 60 to a value below the voltage at which appreciable tunneling will take place. In addition, hot electron injection device 96 will cause hot electrons to be injected onto floating node 20. If the voltage on floating node 20, reflected by the input voltage $V_{in}$, is low, such that the inverter amplifier output is high, P-channel MOS transistors 80 and 82 will both be turned off, turning off hot electron injection device 96. The voltage at node 94, the first end of the tunneling device 60 will be established at a value above the voltage at which tunneling will take place, causing electrons to leave floating node 20.

Because the voltage on tunneling node 94 ranges from highly positive (10 volts) to near zero relative to floating node voltage, the reverse bias voltages encountered by the drains of MOS transistors 86 and 88 are generally beyond those at which a simple MOS transistor can operate. For this reason, these transistors should be constructed in such a manner that they can be operated with high drain voltages without adverse consequences. The exact techniques employed to construct high voltage MOS transistors will depend on the details of the process employed, and are well known to those of ordinary skill in the art. In most processes, the breakdown voltage of the other collector 104 of the hot electron injection device will be much higher than required.

In FIGS. 6a and 6b, the high voltage capability is achieved in transistor 88 by using a lightly doped drain region 140, which may be formed during the p-base diffusion step as is well known in the art. A similar technique is used with transistor 86, by forming a lightly doped drain during the n-well diffusion step.

Figure 7A:
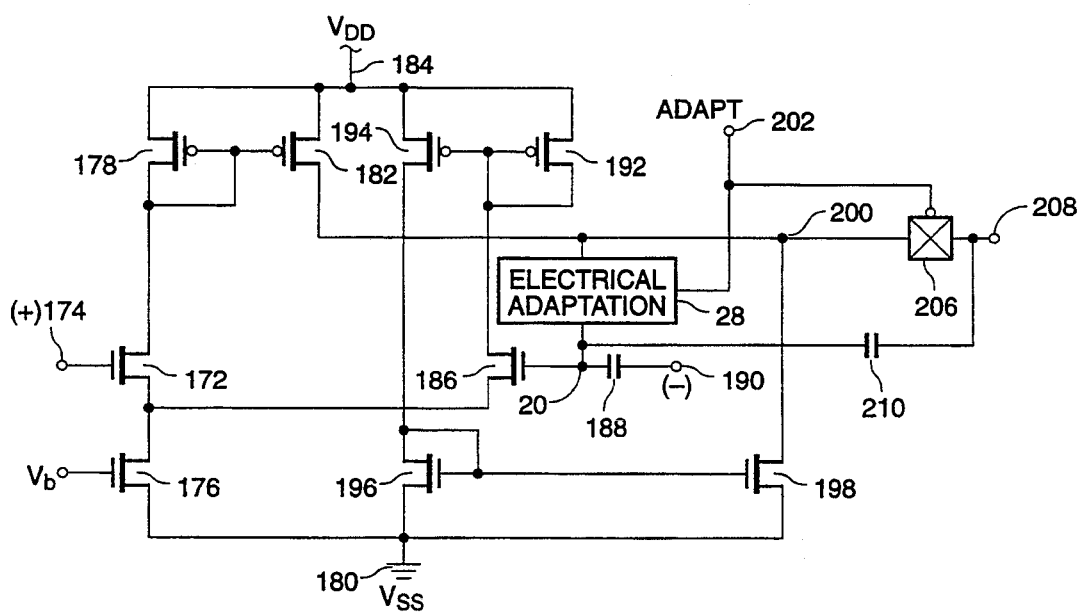
FIG. 7a is a schematic diagram of an alternate embodiment of an electrically-adaptable synaptic element according to the present invention.

Referring now to FIG. 7a, a schematic diagram of a preferred embodiment of a synapse for use in the second layer of the array of the present invention is shown. In the embodiment of FIG. 7a, a transconductance amplifier is utilized. A first N-channel MOS input transistor 172 has its gate connected to a non-inverting input node 174, its source connected to the drain of an N-channel MOS bias transistor 176, and its drain connected to the drain and gate of a first P-channel MOS current mirror transistor 178. The source of N-channel MOS bias transistor 176 is connected to a source of fixed negative voltage $V_{SS}$, shown as ground at reference numeral 180 in FIG. 7a, and its gate is connected to a source of bias voltage $V_b$. The drain and gate of first P-channel MOS current mirror transistor 178 is also connected to the gate of second P-channel MOS current mirror transistor 182. The sources of first and second P-channel MOS current mirror transistors 178 and 182 are connected to a source of fixed positive voltage 184, shown as $V_{DD}$ in FIG. 7a.

A second N-channel MOS input transistor 186 has its gate connected to a floating node 20. A first capacitor 188 has as its first electrode floating node 20 and as its second electrode an inverting input node 190. The source of second N-channel MOS input transistor 186 is connected to the drain of N-channel MOS bias transistor 176, and the drain of second N-channel MOS input transistor 186 is connected to the gate and drain of a third P-channel MOS current mirror transistor 192. The source of third P-channel MOS current mirror transistor 192 is connected to voltage source 184. A fourth P-channel MOS current mirror transistor 194 has its source connected to voltage source 184, its gate connected to the gate of third P-channel MOS current mirror transistor 192, and its drain connected to the gate and drain of first N-channel MOS current mirror transistor 196. The source of first N-channel MOS current mirror transistor 196 is connected to voltage source 180. A second N-channel MOS current mirror transistor 198 has its gate connected to the gate of first N-channel MOS current mirror transistor 196. The drain of second N-channel MOS current mirror transistor 198 is connected to an output node 200 and to the drain of second P-channel MOS current mirror transistor 182.

Floating node 20 is preferably formed from a first polysilicon layer in a double polysilicon layer process and may be referred to as a floating gate. The electrodes of capacitor 188 are formed from floating gate 20 and from a second layer of polysilicon.

Electrical adaptation circuitry, shown schematically at reference numeral 28, is connected between floating node 20 and output node 200. Electrical adaptation circuitry 28 is enabled by a low-active adapt input 202. The preferred embodiment of electrical adaptation circuitry 28 of the synapse of FIG. 7a is the same as that disclosed for the synapse of FIG. 1a.

A pass gate 206 is connected between the output node 200 and a sense node 208 for connection to a common row output line in an array in which the synaptic element is placed. The pass gate is disabled during assertion of the adapt signal. Finally, a second capacitor 210 is connected between sense node 208 and floating node 20.

Figure 7B:
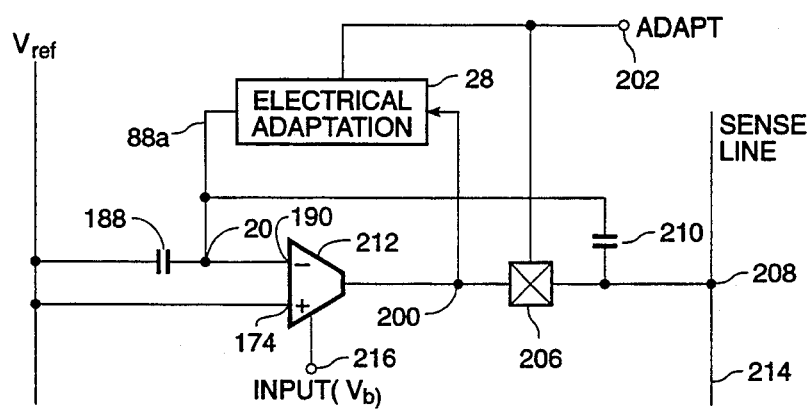

A synaptic amplifier suitable for use as an interpolating synapse in the present invention may be schematically generalized as shown in FIG. 7b, including amplifier symbol 212, electrical adaptation circuitry 28 and its adapt input 202, and capacitors 188 and 210. Non-inverting input node 174 and inverting input node 190 are both connected to a source of reference voltage $V_{ref}$. The input 216 of the amplifier circuit is the $V_b$ input to bias transistor 176 of FIG. 7a. Sense node 208 is shown connected to a sense line 214.

During normal circuit operation, when the adapt signal 202 is not asserted, the circuit of FIGS. 7a and 7b performs as a classic transconductance amplifier. When used as a synaptic element in a synaptic array, inverting input 190 can be the input to the synaptic element and the non-inverting input 174 may be connected to a reference voltage. Those of ordinary skill in the art will recognize, however, that the non-inverting input 174 may also be used as the input to the synaptic element while biasing the inverting input 190, depending on the application. In the preferred embodiment of the invention, both the inverting and non-inverting inputs are connected to a reference voltage as shown in FIG. 7b.

A major difference between the circuits of FIGS. 7a and 7b and prior art amplifier circuits is the ability of the circuit of FIGS. 7a and 7b to be adapted in order to store a synaptic value. When adapt input 202 is asserted, the electrical learning circuitry of the present invention is enabled. Unlike conventional floating gate devices known in the prior art, adaptation of the amplifier structures disclosed herein may take place while the amplifier is performing its normal in-circuit function, while the voltage on floating node 20 is within the normal operating range of the amplifier.

From the two amplifier examples set forth herein, those of ordinary skill in the art will recognize that the present invention is not limited to synapses configured from inverter and transconductance amplifier structures, but rather that the present invention is applicable to amplifiers wherein the gate of at least one transistor comprises a portion of a floating node as taught herein. It is intended that all such amplifier structures are within the scope of the present invention. FIG. 7b shows the preferred synaptic element of the second layer of the array of the present invention.

Figure 7C:
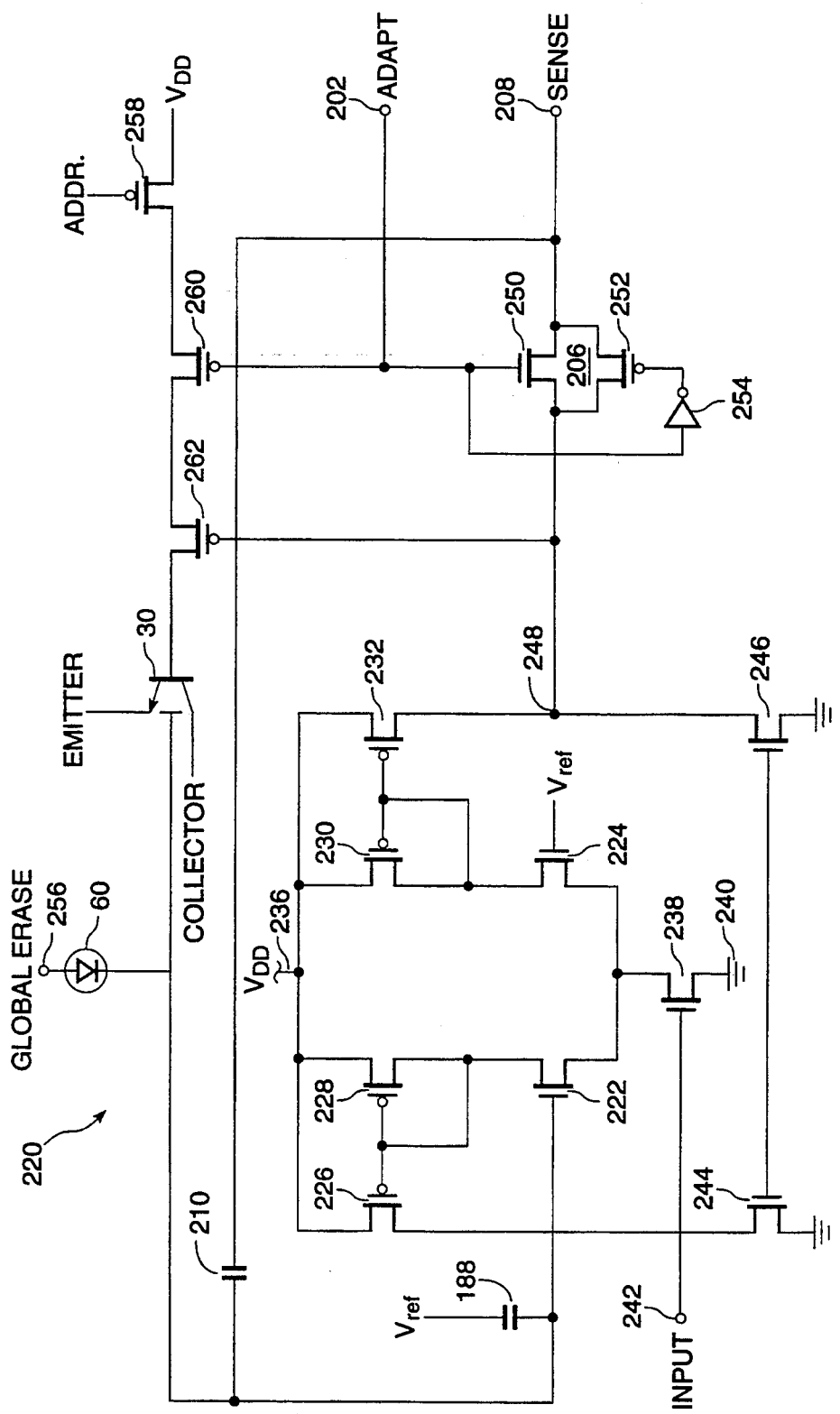
FIG. 7c is a schematic diagram of a presently preferred embodiment of the electrically-adaptable synaptic element of FIG. 7b.

Referring now to FIG. 7c, a schematic diagram of a presently preferred interpolating synaptic element 220 for the second layer of the array of the present invention is depicted with a presently preferred embodiment of electrical adaptation circuitry. Synaptic element 220 comprises an amplifying element including first and second N-channel MOS input transistors 222 and 224 and first and second P-channel current mirrors comprising P-channel MOS current-mirror transistor pairs 226 and 228 and 230 and 232. N-channel MOS input transistor 222 has its gate connected to a reference voltage $V_{ref}$ through capacitor 188 and its drain connected to the gate of P-channel MOS current-mirror transistor 226 and the gate and drain of P-channel MOS current-mirror transistor 228. The sources of P-channel MOS current-mirror transistors 226 and 228 are connected to a voltage source 236 ($V_{DD}$). The source of N-channel MOS input transistor 222 is connected to the drain of N-channel MOS bias transistor 238. The source of N-channel MOS bias transistor 238 is connected to voltage source 240 (ground), and its gate forms an input node 242 for the synaptic element. N-channel MOS input transistor 224 has its gate connected to a reference voltage $V_{ref}$, and its drain connected to the gate of P-channel MOS current-mirror transistor 232 and the gate and drain of P-channel MOS current-mirror transistor 230. The sources of P-channel MOS current-mirror transistors 230 and 232 are connected to voltage source 236 ($V_{DD}$).

The sources of P-channel MOS current-mirror transistors 226 and 232 are connected to the gate of N-channel MOS current mirror transistor 244 and to the drain of N-channel MOS current mirror transistor 246. The sources of N-channel MOS current mirror transistors 244 and 246 are connected to voltage source 240 (ground). The output node 248 of the amplifying element of synaptic element 220 comprises the common drain connection of MOS transistors 232 and 246. The output node 248 is connected to sense node 208 through a pass gate 206 comprising N-channel MOS transistor 250, P-Channel MOS transistor 252, and inverter 254. The control input of the pass gate is connected to low-active adapt node 202.

The gate of N-channel MOS transistor 222 is a portion of a floating node 20 which is used to adapt the synaptic element 220. Non-avalanche hot electron injection device 30 is coupled to floating node 20 as is interpoly tunneling device 60. Examples of both of these devices are described herein.

Interpoly tunneling device 60 is driven by global erase line 256. The collector and emitter of non-avalanche hot electron injection device 30 may be connected as disclosed herein. The base of non-avalanche hot electron injection device 30 is connected to voltage source $V_{DD}$ through three P-channel MOS transistors. P-Channel MOS transistor 258 is used as a select device, and its gate is thus driven by an address signal which may be generated from an appropriate address decoder. P-channel MOS transistor 260 has its gate drive by the signal from adapt node 202. Finally, P-Channel MOS transistor 262 has its gate connected to output node 248 of synaptic element 220. P-Channel MOS transistor 262 is used as a feedback device from synaptic element 220 to control electron injection as a function of output voltage of synaptic element 220.

The synaptic element of FIGS. 7a–7c are wide-range transconductance amplifiers. The output current function of these amplifiers is Iout=G*tanh($V_{in+} - V_{in-}$), where G is a measure of the transconductance and is set by the bias of the amplifier. The outputs of synapses like this one are products of a function of the input $V_b$ on the bias transistor and a stored value on the floating gate; Iout=input*tanh(vref−vfgate). Because the outputs of the synapses for a neuron are connected to a shared sense line, the neuron computes a weighted average of the synapse outputs. The two capacitors soften the output function to give the synapse a wider dynamic range. Because the amplifier is in a feedback configuration, it will try to make the inverting input equal to the non-inverting input. Therefore, the smaller the ratio of the capacitance of 210 to 188 the more the output has to move to make the inputs equal and the larger dynamic range. If the amplifier is programmed to produce zero current at an output voltage $V_{store}$, then: $V_{ref}-V_{gate}$=(-$V_{output}-V_{stored})*C_{210}C_{total}$. For a typical voltage input, the output current of the amplifier is a linear function of $|V_{ref}-V_{gate}|$ over a ±250 mV range. If the ratio of $C_{210}:(C_{210}+C_{188})$ is 1:10 (i.e., 210 is about 30 fF and capacitor 188 is about 0.3 pF) then the output current is linear for a range of $|V_{out}-V_{store}|$ less than about 2.25 volts.

Figure 8:
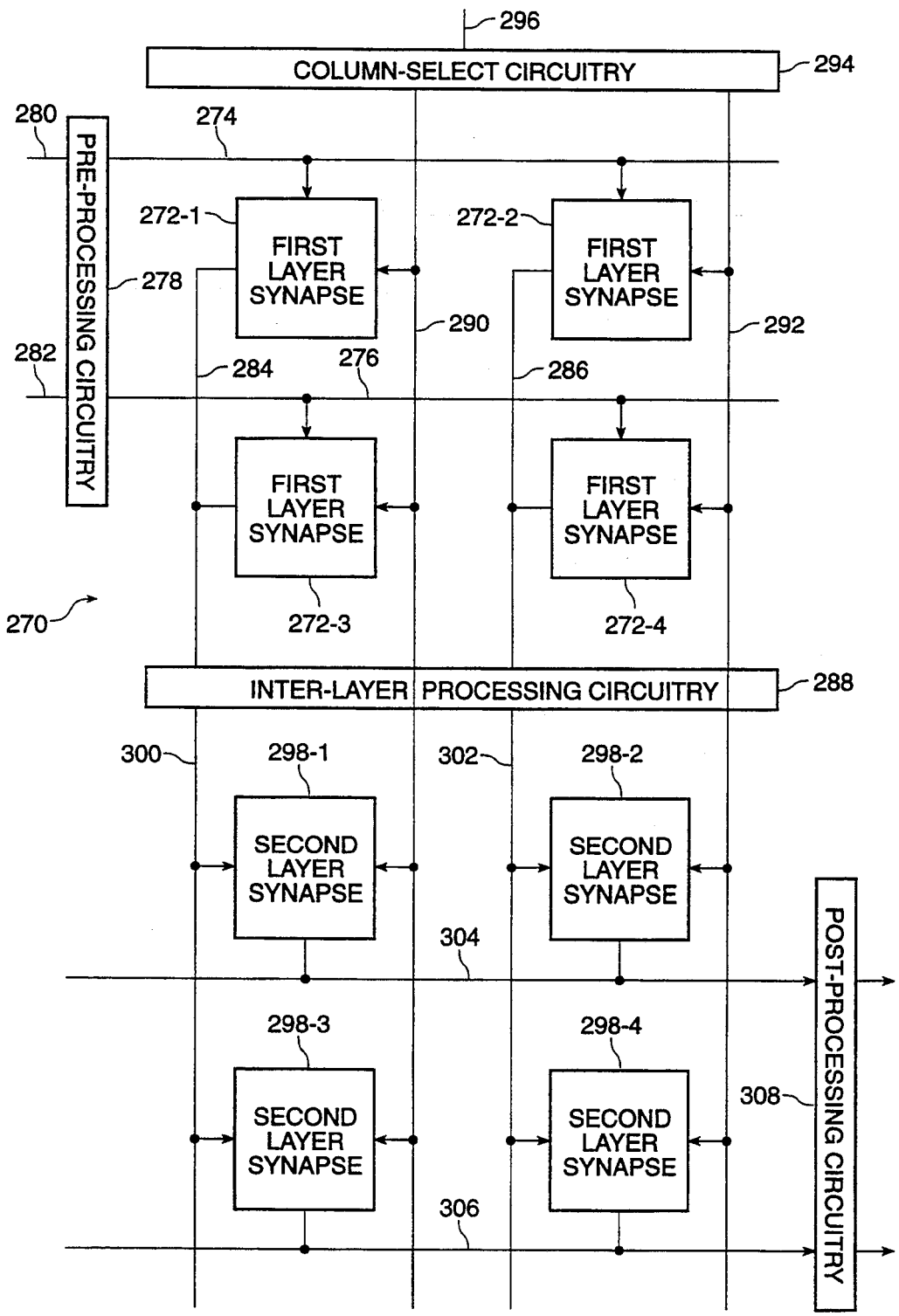
FIG. 8 is a block diagram of a generic two layer array of electrically-adaptable synaptic elements according to the present invention.

Referring now to FIG. 8, a generic two-layer array 270 of electrically-adaptable synaptic elements according to the present invention is shown in block diagram form. In FIG. 8 an array of two rows and two columns of synapses is shown for each layer of the array, but those of ordinary skill in the art will recognize that arrays of arbitrary size are possible.

A first row of the first layer of array 270 contains synaptic elements 272-1 and 272-2; a second row of the array 270 comprises synaptic elements 272-3 through 272-4. The first column of the first layer of the array 270 comprises synaptic elements 272-1 and 272-3. The second column of the first layer of the array 270 comprises synaptic elements 272-2 and 272-4.

A first row input line 274 is connected to the inputs of the synaptic elements in the first row. A second row input line 276 is connected to the inputs of the synaptic elements in the second row. Row input lines 274 and 276 may carry signals driven directly from off chip, or, as shown in FIG. 8, they may carry signals from preprocessing circuitry 278. Preprocessing circuitry 278 may comprise circuitry such as simple buffers, or circuitry for performing more complex functions such as prescaling or normalization. Circuits for performing such functions are well known in the art. Preprocessing circuitry 278 has inputs 280 and 282 which correspond to row lines 274 and 276. Inputs 280 and 282 may carry signals which originate off chip or from another section of the chip containing the array of the present invention.

A first column sense line 284 is connected to the sense nodes of the synaptic elements in the first column. A second column sense line 286 is connected to the sense nodes of the synaptic elements in the second column. If the synaptic elements are configured such that their outputs at the sense nodes are in the form of currents, the currents from the elements in a single column may be summed on a single wire as shown in FIG. 8. Those of ordinary skill in the art will recognize that other more complex arrangements utilizing voltage outputs from the synaptic elements are possible. For example, connecting together the sense node of a column of circuits like that of FIG. 7a will produce a signal that is the weighted average of the individual signals.

Column sense lines 284 and 286 are connected to inter-layer processing circuitry 288. Inter-layer processing circuitry 288 may comprise circuitry such as thresholding circuitry, current-to-voltage converters, linear or non-linear scaling, level shifting, or circuits for computing a squaring function. Such circuitry may be electrically adaptable as taught herein and in the prior related patents and patent applications cited herein.

Finally, the adapt nodes of the synaptic elements in each column of the first layer of the array 270 are connected to an adapt line associated with that column. Thus, the adapt nodes of synaptic elements 272-1 and 273-3 are connected to adapt line 290. The adapt nodes of synaptic elements 272-2, and 272-4 are connected to adapt line 292. According to a presently preferred embodiment of the invention, adapt lines 290 and 292 may be driven from column-select circuitry 294, which, in the embodiment disclosed in FIG. 8, may be a one-of-two decoder circuit, or from a serial shift register. Such circuits are well known in the art. Column-select circuit 294 may be driven from address lines 296 as is known in the art. Those of ordinary skill in the art will understand that the number of address lines 296 will depend on the number of columns present in the array 270.

The second layer of array 270 is illustrated as also including two rows and two columns of synaptic elements. The first row of the second layer comprises synaptic elements 298-1 and 298-2. The second row of the second layer of array 270 comprises synaptic elements 298-3 and 298-4. The first column of the second layer comprises synaptic elements 298-1 and 298-3. The second column of the second layer of array 270 comprises synaptic elements 298-2 and 298-4.

The input nodes of synaptic elements 298-1 and 298-3 of the first column of the second layer of the array are driven by input line 300, an output from inter-layer processing circuitry 288 corresponding to column sense line 284 of the first layer of the array 270. The input nodes of synaptic elements 298-2 and 298-4 of the second column of the second layer of the array are driven by input line 302, an output from inter-layer processing circuitry 288 corresponding to column sense line 286 of the first layer of the array 270.

Outputs from all synapses in each row of the second layer of the array are commonly connected to a row output line, which passes through the post-processing circuitry to form the output of the two-layer network. Thus, row output line 304 is connected to output nodes of the synaptic elements 298-1 and 298-2 of the first row of the second layer of array 270, and row output line 306 is connected to output nodes of the synaptic elements 298-3 and 298-4 of the second row of the second layer of array 270. Row lines 302 and 304 drive post-processing circuitry 306. Post-processing circuitry 308 may comprise circuitry ranging from simple buffers to more complicated circuitry, such as linear or non-linear scaling, level shifting, current-to-voltage conversion, etc. Such circuit elements are well known in the art.

Adapt lines 290 and 292 extend to the second layer of the array 270. Adapt line 290 is connected to the adapt nodes of synaptic elements 298-1 and 298-3 of the first column of the second layer of the array 270 and the adapt line 292 is connected to the adapt nodes of synaptic elements 298-2 and 298-4 of the second column of the second layer of the array 270.

During normal circuit operation, the adapt lines 290 and 292 are inactive, and the input signals presented to the synaptic elements on row input lines 274 and 276 cause output signals on column sense lines 284 and 286. The currents in these sense lines are sensed by sense amplifiers in the inter-layer processing circuitry, which generate voltage signals on lines 300 and 302, which act as inputs to the synapses in the second layer of the array. The output signals from the second layer of the array are processed by post-processing circuitry 308, which provides a plurality of output voltages.

During an adapt mode, a vector of input voltages is presented on row input lines 274 and 276, a vector of desired outputs is driven onto output lines 304 and 306, and a selected one of adapt lines 290 and 292 is activated. While the selected adapt line is activated, each of the synaptic elements in that column is adapted to the input voltage present on its row input line as previously described herein. Circuitry (disclosed in FIG. 9 and FIG. 10) is provided for isolating the outputs of the second layer synaptic elements from one another.

Figure 9:
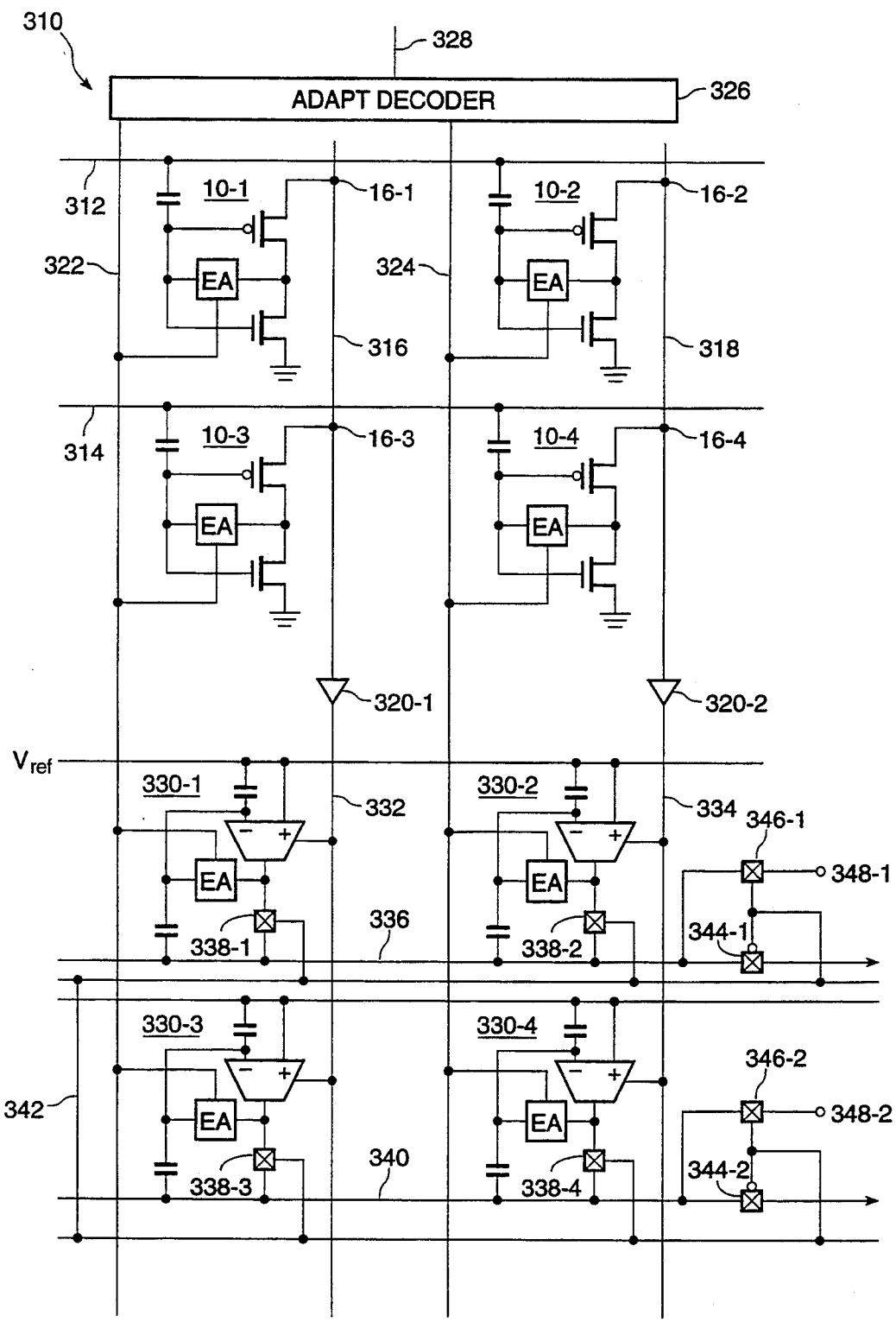
FIG. 9 is a schematic diagram of an illustrative array of electrically-adaptable synaptic elements according to the present invention.

Referring now to FIG. 9, an illustrative embodiment of a two-layer network 310 of synaptic elements according to the present invention is presented in schematic diagram form. An array of four synaptic elements is shown in each of the first and second layers of array 310 of FIG. 9, but those of ordinary skill in the art will recognize that the teachings herein allow the fabrication of arbitrarily sized arrays.

First array of FIG. 9 includes two rows and two columns of synaptic elements in the form of the adaptive inverters of FIG. 1a. Thus a first row includes synaptic elements 10-1 and 10-2 and a second row includes synaptic elements 10-3 and 10-4. The first column includes synaptic elements 10-1 and 10-3 and the second column includes synaptic elements 10-2 and 10-4.

The input nodes of the synaptic elements 10-1 and 10-2 in the first row are connected to a first row input line 312. The input nodes of the synaptic elements 10-3 and 10-4 in the second row are connected to a second row input line 314. First and second row input lines 312 and 314 are driven from signals derived elsewhere on the chip or from off chip, possibly through a suitable buffer or other pre-processing circuit as is well known by those of ordinary skill in the art as shown in FIG. 8.

The current sense nodes 16-1 and 16-3 of the synaptic elements in the first column of the array 310 are connected to a first column current sense line 316. The current sense nodes 16-2 and 16-4 of the synaptic elements in the second column of the array 312 are connected to a second column current sense line 318. First and second column sense lines 316 and 318 are each connected to a suitable sense amplifier (shown at reference numerals 320-1 and 320-2) or other inter-layer processing circuits.

According to a presently preferred embodiment of the invention, amplifiers 320-1 and 320-2 may themselves be electrically-adaptable amplifiers according to the teachings herein.

The adapt inputs of the synaptic elements in each column of the array are connected to an adapt line associated with that column. Thus, the adapt inputs of the electrical adaptation circuitry of synaptic elements 10-1 and 10-3 are connected to adapt line 322. The adapt inputs of the electrical adaptation circuitry of synaptic elements 10-2 and 10-4 are connected to adapt line 324. According to a presently preferred embodiment of the invention, adapt lines 322 and 324 may be driven from an adapt decoder 326, which, in the embodiment disclosed in FIG. 9, may be a one-of-two decoder circuit driven from address lines 328 or a serial shift register as is known in the art.

The second layer of the two-layer array 310 may include a plurality of synaptic elements of the type disclosed in FIGS. 7b and 7c. A first row of the second layer of the array 310 includes synaptic elements 330-1 and 330-2 and a second row includes synaptic elements 330-3 and 330-4. The first column includes synaptic elements 330-1 and 330-3 and the second column includes synaptic elements 330-2 and 330-4. The synaptic elements 330-1 and 330-3 in the first column of the second layer of the array are driven by column input line 332, and the synaptic elements 330-2 and 330-4 in the second column of the second layer of the array are driven by column input line 334. The outputs of synaptic elements 330-1 and 330-2 in the first row are commonly connected to row output line 336 through pass gates 338-1 and 338-2, and the outputs of synaptic elements 330-3 and 330-4 in the second row are commonly connected to row output line 340 through pass gates 338-1 and 338-4. The control inputs of pass gates 338-1 through 338-4 are commonly connected to a control line 342, connected to a source of an adapt mode signal.

Row output line 336 is connected to two pass gates 344-1 and 346-1, and row output line 340 is connected to two pass gates 344-2 and 346-2. The control inputs of these pass gate pairs are complementary, so that one is off while the other is on. The control lines for the pass gates are connected to the adapt mode control line 342.

As in the general embodiment of FIG. 8, during normal circuit operation, the adapt mode signal is not asserted and adapt lines 322 and 324 are inactive, and the input signals presented to the synaptic elements on row input lines 312 and 314 cause output signals on column sense lines 316 and 318. The currents in these sense lines are sensed by sense amplifiers 320-1 and 320-2 in the inter-layer processing circuitry, which generate voltage signals to be used as inputs to the synapses 330-1 through 330-4 in the second layer of the array. Outputs from all synapses in each row of the second layer of the array form the output of the two-layer network and are passed through pass gates 344-1 and 344-2 to post-processing circuitry (not shown).

During an adapt mode, a vector of input voltages is presented on row input lines 312 and 314, a vector of desired outputs is driven onto output lines 336 and 340 and a selected one of adapt lines 322 and 324 is activated. While the selected adapt line is activated, each of the synaptic elements in that column in the first layer of the array are adapted to the input voltage present on its row input line as previously described herein with reference to the circuit of FIG. 1a. In addition, each synaptic element in the second layer of the array is disconnected from its row output line, pass gates 344-1 and 344-2 are turned off and pass gates 346-1 and 346-2 are turned on, thus adapting the synaptic elements in the selected column of the second layer of the array to voltages presented at second layer input nodes 348-1 and 348-2.

Figure 10:
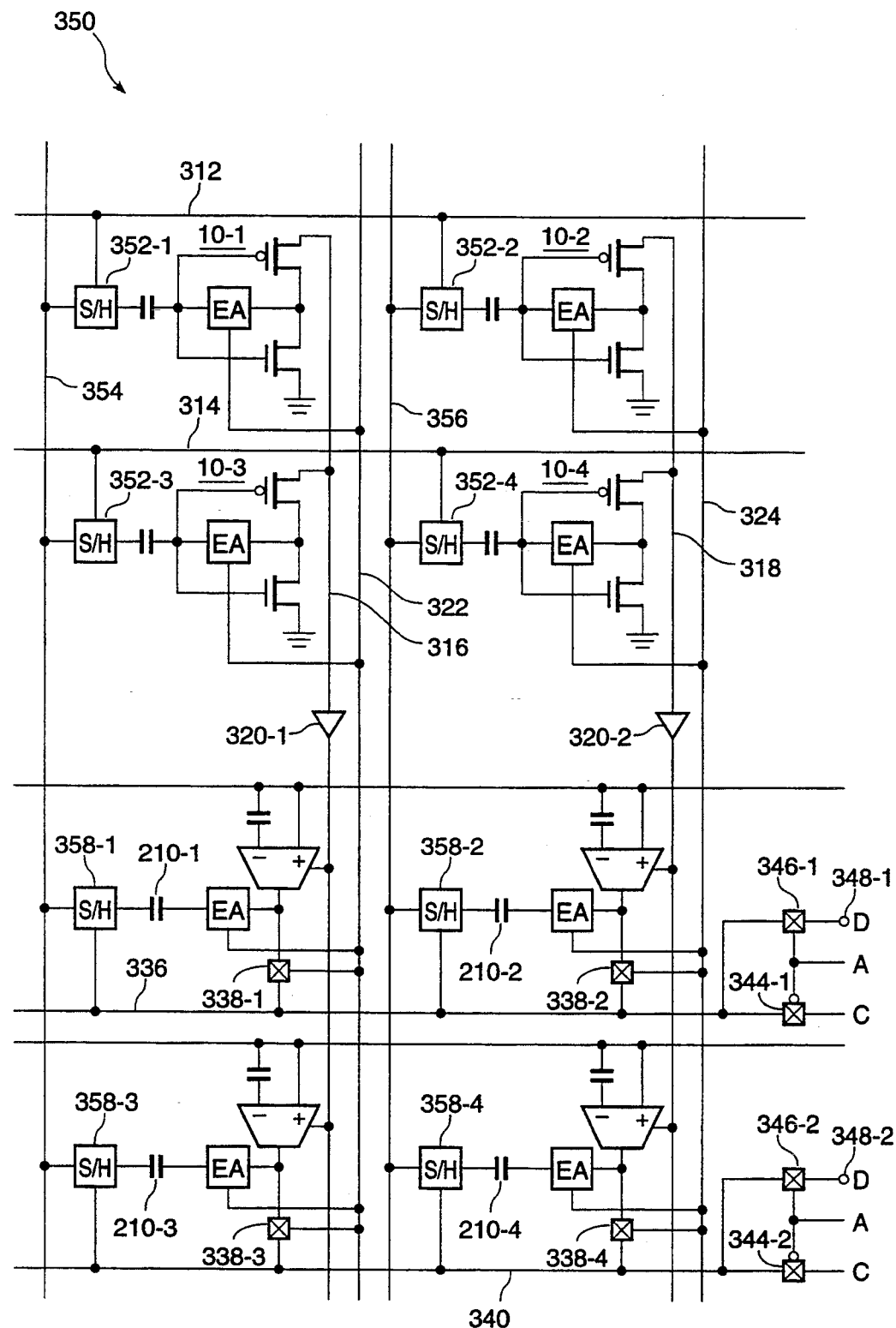
FIG. 10 is a schematic diagram of an illustrative array of electrically-adaptable synaptic elements according to the present invention with sample/hold elements on the inputs.

Referring now to FIG. 10, a two-layer array 350 is shown in schematic diagram form. Similar reference numerals have been used for similar elements. In order to avoid repetition, the operation of the array 350 of FIG. 10 will not be described to the extent that it is identical to the operation of the array 310 of FIG. 9. The array 350 is quite similar to array 310 of FIG. 9, except that sample/hold circuits have been provided in both layers of the array. In the first layer of the array 350, sample/hold circuits 352-1 and 352-2 are interposed between row input 312 and 314 and synaptic elements 10-1 and 10-2 respectively in the first row. In the second row, sample/hold circuits 352-3 and 352-4 are interposed between row input 312 and 314 and synaptic elements 10-3 and 10-4 respectively. The control inputs of sample/hold circuits 352-1 and 352-3 are connected to a sample line 354 and the control inputs of sample/hold circuits 352-2 and 352-4 are connected to a sample line 356. In the first row of the second layer of the array, sample/hold circuits 358-1 and 358-2 are connected between row output line 336 and capacitors 210-1 and 210-2, and in the second row of the second layer of the array, sample/hold circuits 358-3 and 358-4 are connected between row output line 340 and capacitors 210-3 and 210-4. The control inputs of sample/hold circuits 358-1 and 358-3 are connected to a sample line 354 and the control inputs of sample/hold circuits 358-2 and 358-4 are connected to a sample line 356.

As those of ordinary skill in the art will appreciate, the use of the sample/hold circuits in the embodiment of FIG. 10 enables the array 350 to be adapted in a short period of time. As soon as the vector of inputs for one column has been placed on the row lines, the sample control line for that column is triggered. The vector of inputs for the next column can be placed on the row lines while the synapses in the first column are being adapted. During operating mode, the control inputs of the sample/hold circuits may be maintained in a state in which the input value is simply passed through from the input of the sample/hold circuit to its output.

As previously indicated, interlayer processing circuitry 288 may be electrically adaptable. As a non-exhaustive example of electrically-adaptable interlayer processing circuitry, an electrically adaptable sense amplifier element will now be disclosed with reference to FIGS. 11–13.

Figure 11:
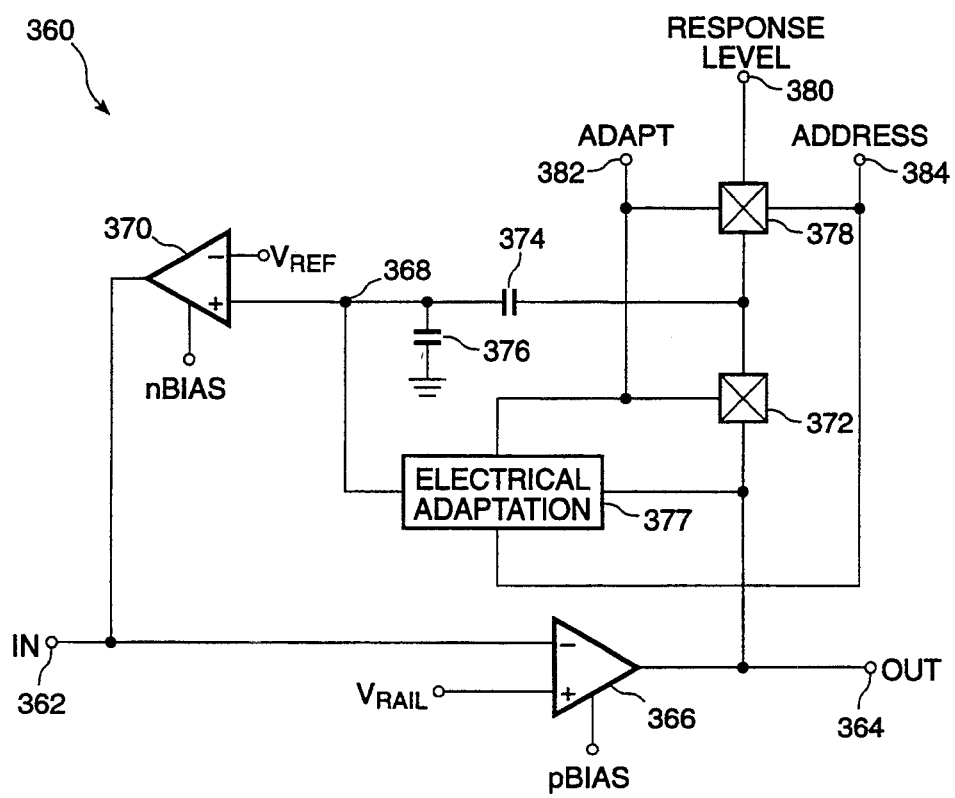
FIG. 11 is a combination schematic and block diagram of a presently preferred embodiment of an electrically-adaptable sense amplifier for use as an interlayer processing element according to the present invention.

Referring first to FIG. 11, a combination schematic and block diagram is shown of a presently preferred embodiment of an electrically-adaptable sense amplifier for use as an interlayer processing element according to the present invention. Electrically-adaptable sense amplifier 360 comprises an input node 362 and an output node 364. Input node 362 is connected to one of the column sense lines from the first layer of the array, and output node 364 is connected to one of the row input lines of the second layer of the array. A first transconductance amplifier 366 has its non-inverting input connected to input node 362 and the output of first transconductance amplifier 370 and its output connected to output node 364.

A second transconductance amplifier 370 is connected as a feedback element for first transconductance amplifier 366, and thus has its non-inverting input connected to a floating node 368 and its output connected to input node 362. The inverting input of second transconductance amplifier 370 is connected to a source of reference voltage $V_{REF}$. The feedback connection to floating node 368 is made through a first pass gate 372 and a first MOS capacitor 374. A second capacitor 376 is connected between floating node 368 and a fixed voltage source such as ground. Electrical adaptation circuitry 377 is connected between output node 364 and floating node 368 of sense amplifier 360.

A second pass gate 378 is connected between a response-level node 380 and first pass gate 372. An adapt signal node 382 is connected to the control inputs of first and second pass gates 372 and 378 and to electrical adaptation circuitry 370. An address input node is connected to second pass gate 372 and electrical adaptation circuitry 377.

During the normal operating mode of the sense amplifier 360, first transconductance amplifier 366 is configured in a negative feedback loop with second transconductance amplifier 370 in the feedback path. The circuit of FIG. 11 will maintain the voltage on the input node 362 as close as possible to the voltage $V_{RAIL}$ applied to the non-inverting input of first transconductance amplifier 366. As current is drawn out of the input node 362 to one of the first layer column sense lines into the synaptic elements of the first layer of the array, the voltage output on the output node 364 will increase due to the action of first transconductance amplifier 366. This voltage increase will be amplified by second transconductance amplifier 370 as it sources the current necessary to pull the voltage on input node 362 back up to the $V_{RAIL}$ voltage level.

The current drawn by the first layer synapses will scale linearly with the number of synaptic elements composing the neuron. The maximum current drawn by a single synaptic element is preferably less than 3 microamps. Second transconductance amplifier 370 in the feedback path should be sized so that it is sufficient to drive the required current. The nBIAS signal attached to the bias of the feedback amplifier adjusts the gain of the feedback amplifier and can be used to adjust the dynamic range of the circuit. For a lower nBIAS voltage level applied to second transconductance amplifier 370, the voltage output to output node 364 will move more for a given current drawn by the first layer synaptic elements connected to input node 362, and conversely for a higher nBIAS voltage value, the output to output node 364 will move less for a given current.

If the nBIAS voltage level is set too low, the feedback amplifier 370 will not be able to drive sufficient current into the input node 362, its output will saturate and the voltage at input node 362 will not be maintained. If the nBIAS is set too high then the voltage response of the circuit may be too low for a sufficient signal-to-noise ratio going into the second layer of the array. The range of nBIAS would preferably be about 1 volt to about 1.25 volts. Capacitors 376 and 374 act as a voltage divider and are used to keep the amplifiers in their linear range. The preferred capacitor ratio of capacitors 376 to 374 is about 4 to 1.

The pBIAS voltage signal used to bias first transconductance amplifier 366 can be used to adjust the output signal drive of the circuit. The first transconductance amplifier 366 has a P-channel MOS transistor as its bias transistor because it is required to produce output voltages between ground and 2.5 volts, preferably in the range of 0 to 1.5 volt. Because transconductance amplifiers can not produce output voltages less than Vt below the bias voltage (well known to those the skilled in the art as the $V_{min}$ problem), a transconductance amplifier with an N-channel MOS transistor as the bias transistor would not suffice. Similarly, because the $V_{RAIL}$ voltage is preferably in the range of 2.5 to 4 volts, the feedback transconductance amplifier is chosen to have an N-channel MOS transistor bias transistor.

Adapt node 382, address node 384, and response-level node 380 are used to electrically adapt sense amplifier 360 during an adapt mode of circuit operation. It is desirable to be able to both compensate the sense amplifiers so that equivalent voltages passed to the second layer of the array mean equivalent responses sent by the first layer, and also to be able to adjust the output voltage range of the sense amplifier to be in the ideal input range for the second layer of the array. The ideal input range for the second layer synaptic elements of the present invention is about 0 to 1.5 volts. Compensation is achieved by fixing an amount of charge on the floating node 368 of each sense amplifier so that the sense amplifier outputs a known voltage for a known state of its first layer synapses. This can be though of in the following manner. The sense amplifier computes a linear function of voltage to input current. The slope of the line can be changed by adjusting the gain with nBIAS; the intercept can be changed by adjusting the charge stored on the floating gate, which slides the whole voltage-response curve up or down.

Figure 12:
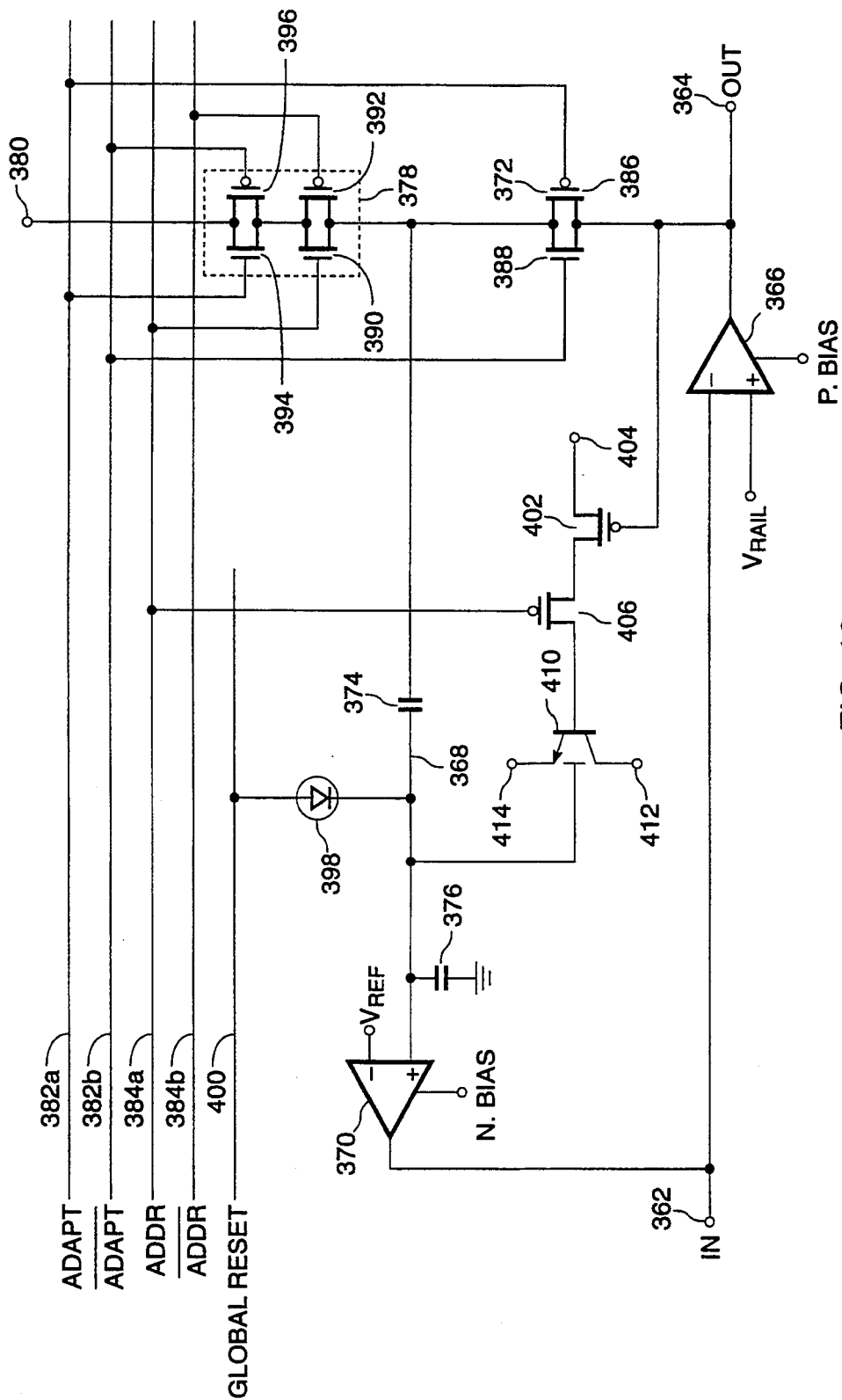
FIG. 12 is a detailed schematic diagram of a preferred embodiment of the electrically-adaptable sense amplifier of FIG. 11.

An understanding of the adapt mode of circuit operation may be more easily understood with reference to FIG. 12, a detailed schematic diagram of a preferred embodiment of the electrically-adaptable sense amplifier of FIG. 11, showing the electrical-adaptation circuitry 377 in more detail. More particularly, pass gate 372 is shown to comprise P-channel MOS transistor 386 having its gate connected to adapt line 382a and N-Channel MOS transistor 388 having its gate connected to complementary adapt line 382b. Pass gate 378 is shown comprising two pass gate pairs of transistors. N-channel MOS transistor 390 having its gate connected to address line 384a and P-Channel MOS transistor 392 having its gate connected to complementary address line 382b, and N-channel MOS transistor 394 having its gate connected to address line 382a and P-Channel MOS transistor 396 having its gate connected to complementary address line 382b. Response-level node 380 is shown connected to MOS pass-gate transistors 394 and 396.

Electron tunneling device 398 is connected between global reset line 400 and floating node 368. P-Channel MOS transistor 402 is connected between node 404 and P-channel MOS transistor 406. The gate of P-Channel MOS transistor 402 is connected to output node 364 and the gate of P-Channel MOS transistor 406 is connected to complementary address line 384b. P-channel MOS transistor 406 is connected to the base of non-avalanche electron injection device 410. The gate of non-avalanche electron injection device 410 is connected to floating node 368, its collector is connected to voltage source 412 and its emitter is connected to voltage source 414.

Figure 13:
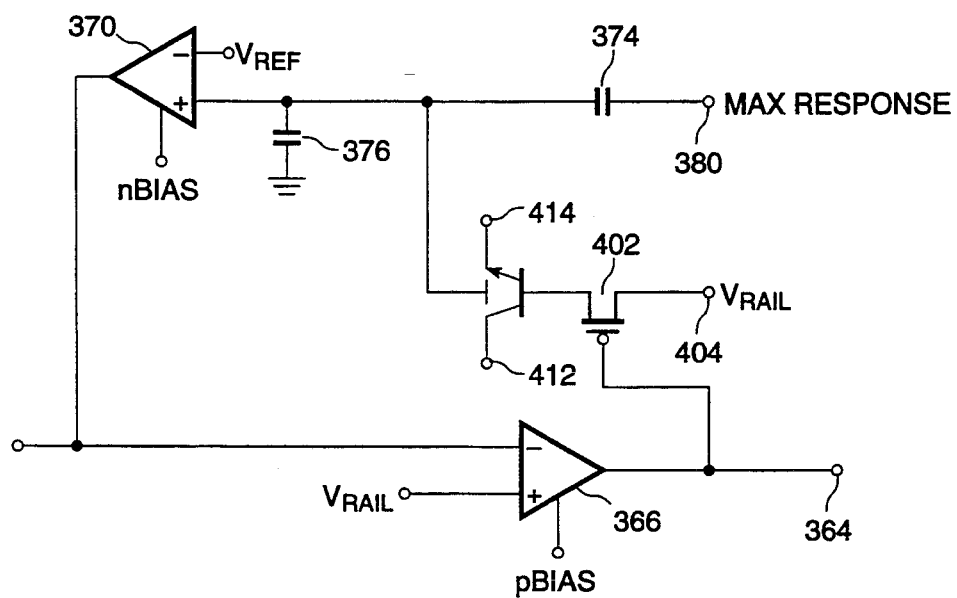
FIG. 13 is an equivalent schematic diagram of the electrically-adaptable sense amplifier of FIG. 12.

FIG. 13 is an equivalent schematic diagram of the electrically-adaptable sense amplifier of FIG. 12 when it is configured in its adapt mode of operation. Circuit operation of the sense amplifier 360 during the adaptation mode can most easily be seen with reference to FIG. 13. If it is assumed that the circuit has previously been tunneled to erase using tunneling device 398, setting the value on the floating gate greater than $V_{REF}$. The feedback loop is broken by turning off pass gate 372. Both transconductance amplifiers 366 and 370 are assumed to have operational gains greater than 1.

The preferable mode of compensation is to hold the inputs to the first layer at their maximum response value, and drive in a desired max response value from off chip. P-channel MOS transistor 402 driving the base of the non-avalanche hot electron device is on until the floating node voltage decreases sufficiently close to $V_{REF}$ such that the inverting input to first transconductance amplifier 366 is sufficiently close to $V_{RAIL}$ to raise its output and shut off P-channel MOS transistor 402 driving the injection. Now, when the circuit is reconfigured in the feedback loop, the max response value will be driven to the output node 364 when the first layer is drawing its maximum response current. The voltage will be the same for all of the sense amplifiers independent of their offsets or of differences in the maximum current drawn by the first layer synaptic elements. Each sense amplifier 360 can be adapted one at a time by using a conventional address decoder to drive the address and complementary address lines 384a and 384b as is well known in the art. Alternatively, all sense amplifiers 360 may be simultaneously adapted if all of the first layer neurons can simultaneously be held at their peak response by using sample/hold circuits as described herein.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A two-layer synaptic array fabricated on a semiconductor substrate comprising:
a first layer comprising:
a plurality of first electrically-adaptable synaptic elements disposed in at least one row and at least one column, each of said first electrically-adaptable synaptic elements in said first layer of said array comprising an input node, an adapt-control signal node, a floating node, electron injecting means coupled to said floating node for injecting electrons on to said floating node while the voltage on said floating node is within the normal operating range of said synaptic element, negative feedback means, coupled between said floating node and said electron injecting means, and responsive to a first adapt signal on said adapt control signal node, for controlling said electron injecting means to vary the rate of injection of electrons on to said floating node in response to the magnitude of the voltage on said floating node, and an output node for supplying a current required by said synaptic element in response to a signal on said input node and said voltage on said floating node;
a row input line associated with each row of said first layer of said array, each said row input line connected to the input nodes of all of said first electrically adaptable synaptic elements associated with its row; and
a column sense line associated with each column of said first layer of said array, each column sense line connected to the output nodes of all of said first electrically adaptable synaptic elements associated with its column;
a plurality of interlayer processing elements, each of said interlayer processing elements having an input connected to one of said column-sense lines, each of said interlayer processing elements further having an output node;
a second layer comprising:
a plurality of second electrically-adaptable synaptic elements disposed in at least one row and at least one column, each of said second electrically-adaptable synaptic elements in said second layer of said array comprising an input node, an adapt-control signal node connected to, a floating node, electron injecting means coupled to said floating node for injecting electrons on to said floating node while the voltage on said floating node is within the normal operating range of said synaptic element, negative feedback means, coupled between said floating node and said electron injecting means, and responsive to a second adapt signal on said adapt-control signal node, for controlling said electron injecting means to vary the rate of injection of electrons on to said floating node in response to the magnitude of the voltage on said floating node, and an output node for supplying a current required by said synaptic element in response to a signal on said input node and said voltage on said floating node;
a second layer column input line associated with each column of said second layer of said array, each second layer column input line connected to the output node of the one of said interlayer processing elements associated with its column and to the input nodes of each of said second electrically-adaptable synaptic elements in said second layer of said array associated with its column;

a second layer row output line associated with each row in said second layer of said array, each said second layer row output line connected to the output nodes of all of said second electrically-adaptable synaptic elements in said second layer associated with its row;

a column adapt control line associated with each column of said first and second layer of said array, each said column adapt control line connected to the adapt control signal nodes of all of said first and second electrically adaptable synaptic elements associated with its column; and means for placing adapt control signals on selected ones of said column adapt control lines to activate an adapt mode of operation of said array.

2. The synaptic array of claim 1 wherein each said electron injecting means in each of said synaptic elements in said first and second layers of said array is a semiconductor structure for performing hot electron injection.

3. The synaptic array of claim 2 wherein each of said electron injecting means is a non-avalanche hot electron injection device including:

a p-type region in said semiconductor substrate;

an n-type region disposed in said p-type region;

a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 2 volts relative to said p-type region, but less than the voltage required to induce avalanche breakdown between said n-type region and said p-type region;

means for capacitively coupling a second positive potential to said floating gate, said second positive potential having a magnitude of greater than about 2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

4. The synaptic array of claim 1 wherein each of said interlayer processing elements comprises an electrically-adaptable element including an input connected to one of said column sense lines of said first layer, an output connected to one of said input lines of said second layer, a floating node coupled to said input, electron injecting means coupled to said floating node for injecting electrons on to said floating node while the voltage on said floating node is within the normal operating range of said synaptic element, negative feedback means, coupled between said floating node and said electron injecting means, and responsive to a signal on an adapt-control signal node, for controlling said electron injecting means to vary the rate of injection of electrons on to said floating node in response to the magnitude of the voltage on said floating node, and further including means for selectively placing an adapt control signal on said adapt control signal node of said interlayer processing element.

5. The synaptic array of claim 1 wherein each of said synaptic elements in said first and second layers of said array further includes electron removal means coupled to said floating node for removing electrons from said floating node while the voltage on said floating node is within the normal operating range of said synaptic element.

6. The synaptic array of claim 5 wherein said electron removal means is a conductor-insulator-conductor structure for performing electron tunneling.

7. The synaptic array of claim 6 wherein said floating node is a layer of polysilicon and said electron removal means includes a second layer of polysilicon separated from said floating node by a layer of $SiO_2$.

8. The synaptic array of claim 5, wherein each synaptic element is further comprised of a negative feedback means, coupled between said floating node and said electron removal means, and responsive to adapt control signals on its respective adapt control signal node for controlling said electron removal means to vary the rate of removal of electrons from said floating node in response to the magnitude of the voltage on said floating node.

9. The synaptic array of claim 1, wherein said first layer of said array further includes a sample/hold circuit connected between the input of each of said first electrically-adaptable synaptic element and its associated row input line, each of said sample/hold circuits including a control input, the control inputs of all said sample/hold circuits associated with each column of said first layer of said array connected to a column sample control line.

10. The synaptic array of claim 1 wherein each of said synaptic elements in said first layer of said array are comprised of electrically-adaptable inverters.

11. The synaptic array of claim 1 wherein each of said synaptic elements in said second layer of said array are blending synapses.

12. A two-layer synaptic array fabricated on a semiconductor substrate comprising:

a first layer comprising:

a plurality of first electrically-adaptable synaptic elements disposed in at least one row and at least one column, each of said first electrically-adaptable synaptic elements comprising an input node, an output node, a current sense node, an inverter including a P-Channel MOS transistor having a drain, a source connected to said current sense node, and a gate connected to a floating node, and an N-Channel MOS transistor having a drain connected to the drain of said P-Channel MOS transistor and to said output node, a gate connected to said floating node, and a source connected to a source of a fixed voltage potential, a capacitor connected between said input node and said floating node, an adapt control signal node, electron injecting means coupled to said floating node for injecting electrons on to said floating node while the voltage on said floating node is within the normal operating range of said inverter, injection control means, responsive to said adapt signal and the voltage on said output node, for generating an electrical injection control signal to control said electron injecting means to increase the rate of injection of electrons on to said floating node in response to an increase in voltage on said floating node and to decrease the rate of injection of electrons on to said floating node in response to a decrease in voltage on said floating node, said current sense node for supplying a current required by said synaptic element at the source of said P-Channel MOS transistor in response to a signal on said input node and said voltage on said floating node;

a row input line associated with each row of said first layer of said array, each said row input line connected to the input nodes of all of said electrically adaptable synaptic elements associated with its row; and a column sense line associated with each column of said first layer of said array, each column sense line connected to the current sense nodes of all of said electrically adaptable synaptic elements associated with its column;

a plurality of interlayer processing elements, individual ones of said interlayer processing elements having an input connected to one of said column-sense lines, and an output node;

a second layer comprising:

a plurality of second electrically-adaptable synaptic elements disposed in at least one row and at least one column, said at least one column corresponding to said at least one column of synaptic elements in said first layer, each of said second electrically-adaptable synaptic elements in said second layer of said array comprising an input node, an output node, a current sense node, a switching element connected between said output node and said current sense node, said switching element having a control element, a transconductance amplifier having a bias input connected to said input node, an inverting input connected to a floating node, a non-inverting input connected to a fixed voltage source, and an output connected to said output node, said current sense node for supplying a current required by said synaptic element in response to a signal on said input node and a voltage on said floating node, a first capacitor having a first plate connected to a fixed voltage source and a second plate connected to said floating node, a second capacitor having a first plate connected to said floating node and a second plate connected to said current sense node, an adapt control signal node, electron injecting means coupled to said floating node for injecting electrons on to said floating node while the voltage on said floating node is within the normal operating range of said amplifier, negative feedback means, coupled between said floating node and said electron injection means, and responsive to said signal on said adapt control signal node for controlling said electron injecting means to vary the rate of injection of electrons on to said floating node in response to the magnitude of the voltage on said floating node;

a second layer column input line associated with each column in said second layer of said array, each second layer column input line connected to the output node of the one of said interlayer processing elements associated with its column and to the inputs of each of said electrically-adaptable synaptic elements in said second layer of said array associated with its column;

a second layer row output line associated with each row in said second layer of said array, each said second layer row output line connected to the current sense nodes of all of said electrically adaptable synaptic elements in said second layer associated with its row;

a column adapt control input line associated with each corresponding column of said first and second layers of said array, each said column adapt control input line connected to the adapt control signal nodes of all of said electrically adaptable synaptic elements associated with its column in both said first and second layers of said array;

means for placing an adapt control input signal on a selected one of said column adapt control input lines and to said control element of each of said switching elements in said second electrically-adaptable synaptic elements so as to disconnect said output node from said current sense node to activate an adapt mode of operation of said array;

means for placing a desired vector of input voltages on the row input lines of said first layer of the array during said adapt mode of operation; and means for placing a desired vector of output voltages on the row sense lines of said second layer of the array during said adapt mode of operation.

13. The synaptic array of claim 12 wherein each said electron injecting means in each of said synaptic elements in said first and second layers of said array is a semiconductor structure for performing hot electron injection.

14. The synaptic array of claim 13 wherein each of said electron injecting means is a non-avalanche hot electron injection device including:

a p-type region in said semiconductor substrate;

an n-type region disposed in said p-type region;

a floating gate disposed above said p-type region, said floating gate at least partially overlapping one edge of said n-type region and separated from the surface of said substrate by a gate oxide under a portion of said floating gate including at least where it partially overlaps the edge of said n-type region;

means for applying a first positive potential to said n-type region with respect to said p-type region to reverse bias said n-type region, said positive potential having a magnitude greater than about 2 volts relative to said p-type region, but less than the voltage required to induce avalanche breakdown between said n-type region and said p-type region;

means for capacitively coupling a second positive potential to said floating gate, said second positive potential having a magnitude of greater than about 2 volts relative to said p-type region;

means for injecting electrons into said p-type region;

whereby said first and second positive potentials act to accelerate said electrons to an energy sufficient to surmount the barrier energy of said gate oxide and thereby inject said electrons onto said floating gate.

15. The synaptic array of claim 12 wherein each of said interlayer processing element comprises an electrically-adaptable element including a floating node, electron injecting means coupled to said floating node for injecting electrons on to said floating node while the voltage on said floating node is within the normal operating range of said electrically adaptable element, negative feedback means, coupled between said floating node thereof, and said electron injection means, and responsive to a signal on an adapt-control signal node, for controlling said electron injection means to vary the rate of injection of electrons on to said floating node in response to the magnitude of the voltage on said floating node, and further including means for selectively placing an adapt control signal on said adapt control signal node of said interlayer processing element.

16. The synaptic array of claim 12 wherein each of said synaptic elements in said first and second layers of said array further includes electron removal means coupled to said floating node for removing electrons from said floating node while the voltage on said floating node is within the normal operating range of said synaptic element.

17. The synaptic array of claim 16 wherein said electron removal means is a conductor-insulator-conductor structure for performing electron tunneling.

18. The synaptic array of claim 17 wherein said floating node is a layer of polysilicon and said electron removal means includes a second layer of polysilicon separated from said floating node by a layer of $SiO_2$.

19. The synaptic array of claim 16, wherein each synaptic element is further comprised of a negative feedback means, coupled between said floating node and said electron removal means, and responsive to adapt control signals on its respective adapt control signal node for controlling said electron removal means to vary the rate of removal of electrons from said floating node in response to the magnitude of the voltage on said floating node.

20. The synaptic array of claim 12 wherein each of said synaptic elements in said first layer of said array are comprised of electrically-adaptable inverters.

21. The synaptic array of claim 12 wherein each of said synaptic elements in said second layer of said array are interpolating synapses.

22. The synaptic array of claim 12, wherein said array further includes:
- a plurality of first sample/hold circuits, one of said first sample/hold circuits connected between the input of each of said first electrically-adaptable synaptic element and its associated row input line, each of said first sample/hold circuits including a control input;
- a plurality of second sample/hold circuits, one of said second sample/hold circuits connected between the input of each of said second electrically-adaptable synaptic element and its associated column input line, each of said second sample/hold circuits including a control input;
- a sample control line associated with each column of said array, each sample control line connected to the control inputs of the ones of said first and second sample/hold circuits associated with its column; and
- sample control means, coupled to said sample control lines, for selectively activating said sample control lines during an adapt mode of said synaptic array.

* * * * *

UNITED STATES PATENT AND TRADEMARK OFFICE
CERTIFICATE OF CORRECTION

PATENT NO. : 5,381,515
DATED : January 10, 1995
INVENTOR(S) : John C. Platt, Janeen D. W. Anderson It is certified that error appears in the above-indentified patent and that said Letters Patent is hereby corrected as shown below:

Column 14, line 63, replace "(-" with --(--.

Column 19, line 45, replace "370" with --377--.

Col. 21, line 6, replace "382b" with --384b--.

Column 21, line 7, replace "address" with --adapt--.

Column 21, line 9, replace "address" with --adapt--.

Signed and Sealed this

Twenty-first Day of May, 1996

Attest:

BRUCE LEHMAN

Attesting Officer      Commissioner of Patents and Trademarks